United States Patent
De Matos Gomes

(10) Patent No.: US 11,921,178 B2
(45) Date of Patent: Mar. 5, 2024

(54) SYSTEMS AND METHODS FOR ULTRALOW FIELD RELAXATION DISPERSION

(71) Applicant: PROMAXO, INC., Oakland, CA (US)

(72) Inventor: Muller Francis De Matos Gomes, Hayward, CA (US)

(73) Assignee: Promaxo, Inc., Oakland, CA (US)

( * ) Notice: Subject to any disclaimer, the term of this patent is extended or adjusted under 35 U.S.C. 154(b) by 0 days.

(21) Appl. No.: 17/430,387

(22) PCT Filed: Feb. 14, 2020

(86) PCT No.: PCT/US2020/018352
§ 371 (c)(1),
(2) Date: Aug. 12, 2021

(87) PCT Pub. No.: WO2020/168233
PCT Pub. Date: Aug. 20, 2020

(65) Prior Publication Data
US 2022/0146613 A1 May 12, 2022

Related U.S. Application Data

(60) Provisional application No. 62/806,664, filed on Feb. 15, 2019.

(51) Int. Cl.
*G01R 33/44* (2006.01)
*G01R 33/38* (2006.01)
(Continued)

(52) U.S. Cl.
CPC ....... *G01R 33/445* (2013.01); *G01R 33/3808* (2013.01); *G01R 33/383* (2013.01); *G01R 33/48* (2013.01)

(58) Field of Classification Search
None
See application file for complete search history.

(56) References Cited

U.S. PATENT DOCUMENTS

2002/0175681 A1* 11/2002 Taicher .................... G01V 3/32
324/303
2010/0160173 A1 6/2010 Mchale et al.
(Continued)

FOREIGN PATENT DOCUMENTS

JP 2000286314 A 10/2000
JP 2018505009 A 2/2018
(Continued)

OTHER PUBLICATIONS

Supplementary European Search Report for corresponding European Patent Application No. 20756154.9, dated Sep. 15, 2022.
(Continued)

*Primary Examiner* — Rodney E Fuller
(74) *Attorney, Agent, or Firm* — Wilson Sonsini Goodrich & Rosati

(57) ABSTRACT

A system of field cycled magnetic resonance system and a method of operating a field cycled magnetic resonance system are described. In accordance with various embodiments, the disclosed system includes a static field magnet, wherein the magnet is configured to provide a low static external magnetic field to a given field of view, a radio frequency coil, and a field cycling magnet. In accordance with various embodiments, the method includes providing a static field magnet configured to image a tissue sample within a given field of view, applying a low static external magnetic field to the given field of view, providing a radio frequency coil configured to produce cycling radio frequency field, providing a field cycling magnet, altering the low static external magnetic field within the given field of view, and collecting images from the system.

20 Claims, 11 Drawing Sheets

(51) Int. Cl.
*G01R 33/383* (2006.01)
*G01R 33/48* (2006.01)

(56) References Cited

U.S. PATENT DOCUMENTS

| | | | |
|---|---|---|---|
| 2012/0098539 | A1 | 4/2012 | Sakellariou et al. |
| 2015/0054510 | A1 | 2/2015 | Biber et al. |
| 2015/0260809 | A1 | 9/2015 | Vidarsson |
| 2018/0103890 | A1 | 4/2018 | Piron et al. |
| 2018/0143280 | A1* | 5/2018 | Dyvorne ............ G01R 33/5608 |
| 2018/0220949 | A1 | 8/2018 | Prado |
| 2018/0356480 | A1 | 12/2018 | Weinberg et al. |

FOREIGN PATENT DOCUMENTS

| | | |
|---|---|---|
| JP | 2018505751 A | 3/2018 |
| WO | 02095447 A2 | 11/2002 |
| WO | 2018098267 A1 | 5/2018 |
| WO | 2020168233 A1 | 8/2020 |

OTHER PUBLICATIONS

Lurie et al., Fast field-cycling magnetic resonance imaging, Comptes Rendus—Physique (Jul. 27, 2010), 11 (2):136-148.
Cooley et al., Design of sparse Halbach magnet arrays for portable MRI using a genetic algorithm, IEEE Transactions on Magnetics (Oct. 23, 2017), 54(1):1-25.
Matter et al., Rapid Polarizing Field Cycling in Magnetic Resonance Imaging, IEEE Transactions on Medical Imaging (Jan. 2006), 25(1):84-93.
Bödenler et al., Comparison of fast field-cycling magnetic resonance imaging methods and future perspectives, Molecular Physics (Dec. 18, 2018), 117(7-8):832-848.
International Search Report and Written Opinion for International PCT Application No. PCT/US2020/018352, dated May 4, 2020.
International Preliminary Report on Patentability for International PCT Application No. PCT/US2020/018352, dated Mar. 31, 2021.
Volegov et al., Magnetic Resonance Relaxometry at Low and Ultra Low Fields, National Institute of Health (Jul. 25, 2011), 28:82-87.
Van Landeghem, Maxime et al. Low-gradient single-sided NMR sensor for one-shot profiling of human skin. Journal of Magnetic Resonance 215 (2012) 74-84.

* cited by examiner

SYSTEMS AND METHODS FOR ULTRALOW FIELD RELAXATION DISPERSION

CROSS-REFERENCE TO RELATED APPLICATIONS

The present application is a U.S. National Stage Entry under 35 U.S.C. § 371 of International PCT Application No. PCT/US2020/018352, entitled "SYSTEMS AND METHODS FOR ULTRALOW FIELD RELAXATION DISPERSION," filed Feb. 14, 2020, which claims the benefit of priority under 35 U.S.C. § 119(e) to U.S. Provisional Application No. 62/806,664, entitled "SYSTEMS AND METHODS FOR ULTRALOW FIELD RELAXATION DISPERSION" and filed on Feb. 15, 2019, the entire contents of which are hereby incorporated by reference herein for all purposes.

BACKGROUND

The embodiments disclosed herein are generally directed towards systems and methods for imaging tissue samples and patients via, for example, magnetic resonance imaging (MRI).

It is well known that an MRI system's effectiveness can be strongly correlated with its ability to generate quality contrast in an image, to thereby better distinguish between different kinds of tissues and/or changes within a single kind of tissue. The more that different individual voxels differ in contrast, the more readily a physician can make a diagnosis. Therefore, it is a well-known desire in the industry to develop systems that enable the increase of contrast as much as possible. Contrast depends on the relaxation times of a tissue. By extension, since the relaxation times of different tissues vary as a function of magnetic field, if the MRI system provides for varying magnetic fields, contrast of an image can be better maximized.

It is also well known that producing a magnetic field cycled MRI with conventional means is typically infeasible. Different methods therefore can be used to facilitate magnetic field cycling. One such method of producing different magnetic fields is spin locking. The majority of MRI systems can spin lock portions of tissue but doing so it not always practical. Moreover, current MRI systems typically spin lock excised tissues, as opposed to in vivo. Spin locking requires that magnetization be affected by a magnetic field greater than any offset the tissue may experience, which can result in a large amount of energy being deposited into tissue. At high fields, the strength needed to spin lock may be greater than specific absorption rates (SAR) standards allow, therefore exposing enormous amounts of energy to the human body during an MRI scan.

Another method of producing cycled magnetic fields is to use a peripheral to alter the static magnetic field within the field of view. Doing so would require, for example, inserts into the bore of a conventional MRI scanner, which is already cramped. Just getting the often ferromagnetic (ferromagnetic cores can increase the strength of an electromagnet) electromagnet into an MRI scanner room without destroying the scanner is known to be difficult. Conventional MRI scanners generally exert too much force on ferromagnetic materials. Even removing something as small as a steel wrench from a scanner is difficult and may require turning the magnetic field off, an expensive process.

Given these deficiencies, a need exists to develop MRI systems and methods that maximize contrast in the image by effectively cycling the magnetic field using methods such as, for example, spin locking and added peripherals, which are not currently feasible.

SUMMARY

In accordance with various embodiments, a magnetic resonance system is provided. The magnetic resonance system includes a static field magnet, wherein the magnet is configured to provide a low static external magnetic field to a given field of view, and a radio frequency coil configured to apply pulsed cycling radio frequency field to the low static external magnetic field. The magnetic resonance system further includes a field cycling magnet disposed proximate to the static field magnet and is concentric with the static field magnet. The field cycling magnet is configured for altering the low static external magnetic field. The magnetic resonance system is a single-sided magnetic resonance imaging system.

In accordance with various embodiments, a magnetic resonance system is provided. The magnetic resonance system includes a static field magnet, wherein the magnet is configured to provide a low static external magnetic field to a given field of view, and a field cycling magnet disposed proximate to the static field magnet and is concentric with the static field magnet. The magnetic resonance system further includes a radio frequency coil configured to apply pulsed cycling radio frequency field to the low static external magnetic field. The magnetic resonance system is a single-sided magnetic resonance imaging system.

In accordance with various embodiments, a magnetic resonance system is provided. The magnetic resonance system includes a static field magnet, wherein the magnet is configured to provide a low static external magnetic field to a given field of view; a radio frequency coil, and a field cycling magnet. The radio frequency coil is configured to apply pulsed cycling radio frequency field to the low static external magnetic field. The field cycling magnet is configured to alter the low static external magnetic field within the given field of view. The magnetic resonance system is a single-sided magnetic resonance imaging system.

In accordance with various embodiments, a method of operating a field cycled magnetic resonance system is provided. The method includes providing a static field magnet configured to image a tissue sample within a given field of view, applying a low static external magnetic field to the given field of view, providing a radio frequency coil configured to produce cycling radio frequency field, applying pulsed cycling radio frequency field to the low static external magnetic field, and collecting images from the system. The method further includes providing a field cycling magnet, and altering the low static external magnetic field within the given field of view. The magnetic resonance system is a single-sided magnetic resonance imaging system.

In accordance with various embodiments, a method of operating a field cycled magnetic resonance system is provided. The method includes providing a static field magnet configured to image a tissue sample within a given field of view, applying a low static external magnetic field to the given field of view; providing a field cycling magnet, altering the low static external magnetic field within the given field of view, and collecting images from the system. The method further includes providing a radio frequency coil configured to produce cycling radio frequency field, and applying pulsed cycling radio frequency field to the low static external magnetic field. The magnetic resonance system is a single-sided magnetic resonance imaging system.

In accordance with various embodiments, a method of operating a field cycled magnetic resonance system is provided. The method includes providing a static field magnet configured to image a tissue sample within a given field of view, applying a low static external magnetic field to the given field of view, providing a radio frequency coil configured to produce cycling radio frequency field, providing a field cycling magnet, altering the low static external magnetic field within the given field of view, and collecting images from the system. The method further includes applying pulsed cycling radio frequency field to the low static external magnetic field. The magnetic resonance system is a single-sided magnetic resonance imaging system.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

Figure 1:
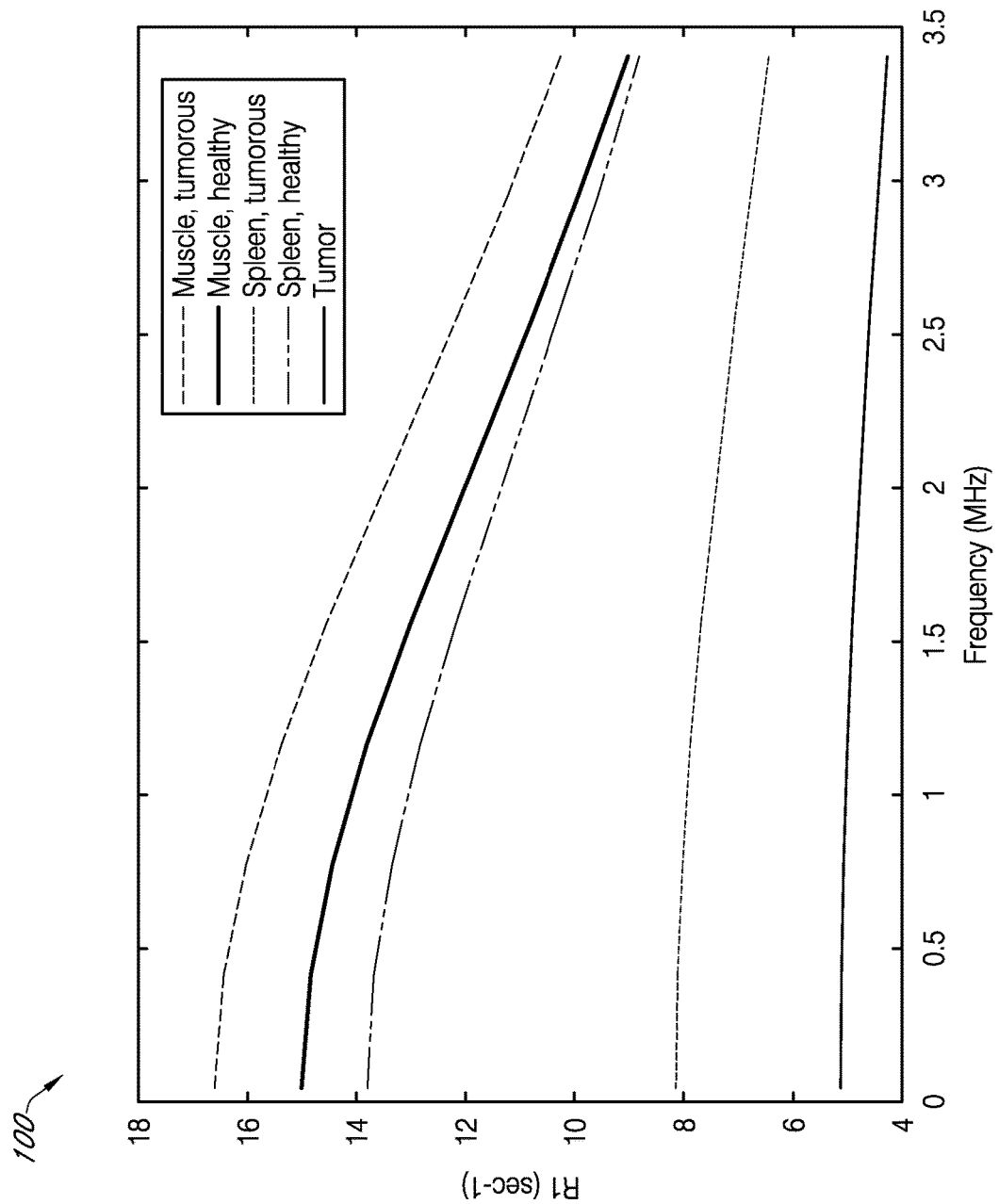
FIG. 1 is a plot diagram that illustrates relaxation dispersion of various kinds of tissues, in accordance with various embodiments.

It is to be understood that the figures are not necessarily drawn to scale, nor are the objects in the figures necessarily drawn to scale in relationship to one another. The figures are depictions that are intended to bring clarity and understanding to various embodiments of apparatuses, systems, and methods disclosed herein. Wherever possible, the same reference numbers will be used throughout the drawings to refer to the same or like parts. Moreover, it should be appreciated that the drawings are not intended to limit the scope of the present teachings in any way.

DETAILED DESCRIPTION

The following description of various embodiments is exemplary and explanatory only and is not to be construed as limiting or restrictive in any way. Other embodiments, features, objects, and advantages of the present teachings will be apparent from the description and accompanying drawings, and from the claims.

Unless defined otherwise, all technical and scientific terms used herein have the same meaning as commonly understood by one of ordinary skill in the art to which their various embodiments belong.

All publications mentioned herein are incorporated herein by reference for the purpose of describing and disclosing devices, compositions, formulations and methodologies which are described in the publication and which might be used in connection with the present disclosure.

As used herein, the terms "comprise", "comprises", "comprising", "contain", "contains", "containing", "have", "having" "include", "includes", and "including" and their variants are not intended to be limiting, are inclusive or open-ended and do not exclude additional, unrecited additives, components, integers, elements or method steps. For example, a process, method, system, composition, kit, or apparatus that comprises a list of features is not necessarily limited only to those features but may include other features not expressly listed or inherent to such process, method, system, composition, kit, or apparatus.

Nuclear magnetic resonance (NMR) relaxation of the isotope hydrogen 1 is primarily the result of random modulation of the dipolar coupling between spins in the object of interest. The rate of relaxation will depend on the type of relaxation being measured and the motions contributing to the relaxation. In magnetic resonance imaging (MRI), the signal will primarily be generated by water in the body. The random rotational diffusion that characterizes the relaxation of this water can vary in its timescales. Free water, such as the water found in cerebral spin fluid, urine, or blood will rotationally diffuse with a correlation time on the order of tens of picoseconds, with the exact number varying with the viscosity of the fluid. Not all water in the body is free and there can be in fact bound water in the human body.

If water is in contact with tissue, some fraction of that water will likely interact with that tissue. This interaction may take the form of binding with the proteins that make up the tissue. These proteins frequently have cavities capable of accepting a water molecule. These cavities are commonly small enough to constrain the motions of the water bound within. The motion of the water within the cavity can be sufficiently constrained to alter the overall rotational correlation time of the water molecule within the associated cavity. The rotational correlation time of the bound water will therefore approach that of the protein it is bound to.

This bound water will relax at rates much slower than the relaxation rates of free water. This bound water will also exchange with the free water. The timescale of this exchange is on the order of microseconds. Therefore, in any given tissue sample, there are two populations of water, bound and free and these two populations are exchanging. As a result, slowly relaxing free water is constantly mixing with rapidly relaxing bound water. Since the free and bound water cannot be distinguished spectroscopically or spatially, the water measured with a scanner will relax with an overall relaxation time constant. This relaxation time constant will be characterized by the rotational correlation time of the proteins that bind the water, which ranges from tens to hundreds of nanoseconds.

There is therefore a great difference in the rotational correlation time between the free water, which has a rotational correlation time on the order of tens of picoseconds, and bound water, which has a rotational correlation time of tens of nanoseconds. This difference in correlation time affects the relaxation dispersion of water, and therefore the relaxation dispersion of tissue. To further elucidate the effects of relaxation dispersion, FIGS. 1, 2, and 3 shown below illustrate various measurements for example relaxation dispersions of different tissue types and samples.

FIG. 1 is a plot diagram 100 that illustrates relaxation dispersion of various kinds of tissues, in accordance with various embodiments. The plot diagram 100 illustrates relaxation dispersion of various kinds of tissues, as shown in the figure. As seen in FIG. 1, the relaxation time of tissue can change dramatically as a function of Larmor frequency (the precessional frequency of the magnetic moment of a proton or electron around a magnetic field). It can be useful to change the Larmor frequency so that tissues with similar relaxation times can be distinguished. The variation in relaxation time as a function of Larmor frequency is known as relaxation dispersion. Measuring the relaxation dispersion of a sample is a sensitive way to characterize its dynamics and distinguish it from other kinds of samples. Moreover, as FIG. 1 also illustrates, while some tissues can closely resemble each other at high frequencies (i.e., a high magnetic field), and therefore are hard to distinguish, those same tissues can differ more at lower frequencies, therefore allowing for greater contrast and thus greater ability to distinguish between tissues of seemingly similar relaxation times.

Figure 2:
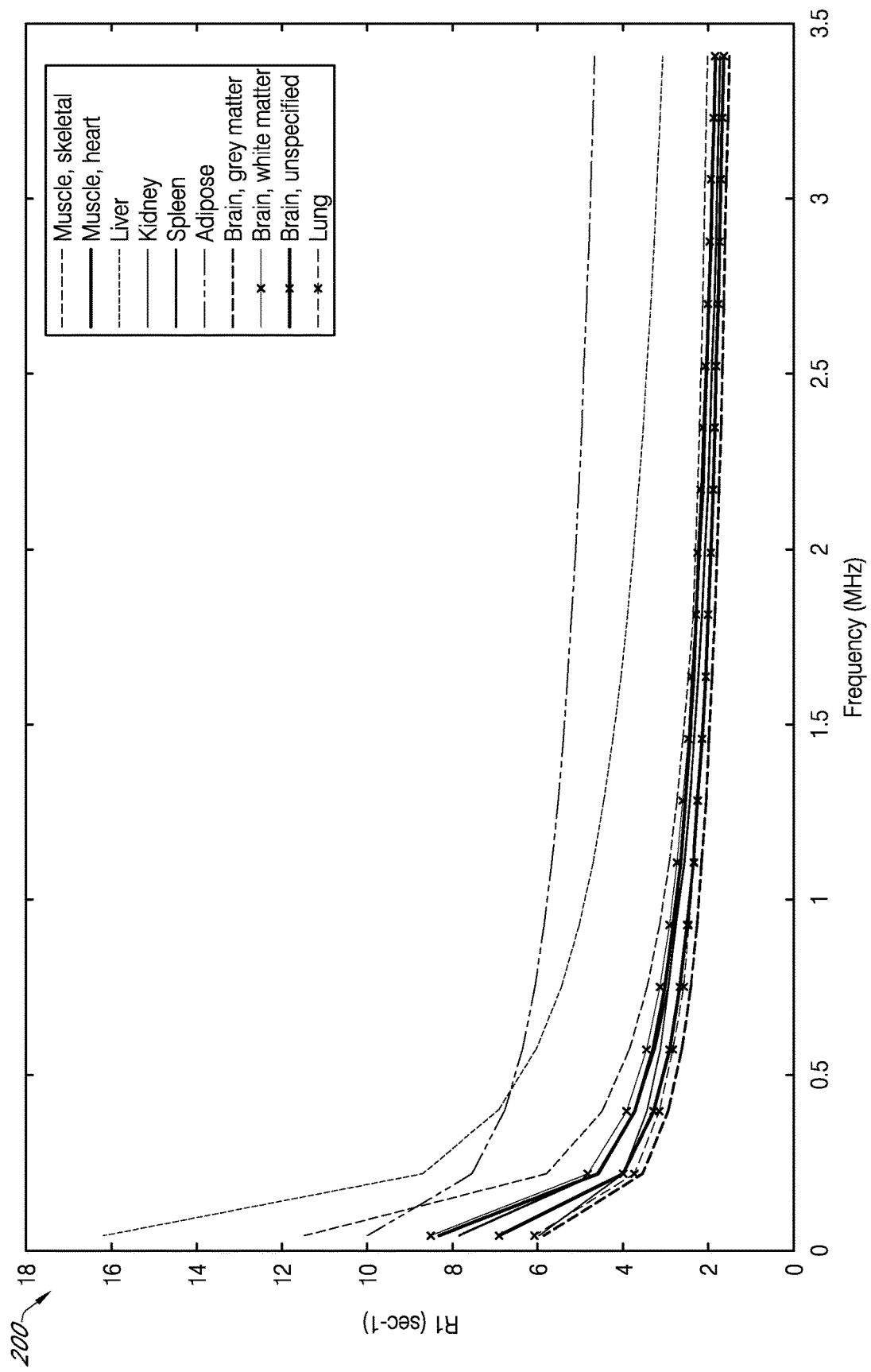
FIG. 2 is a plot diagram that illustrates relaxation dispersion of various kinds of tissues, in accordance with various embodiments.

Referring now to FIG. 2, which is a plot diagram 200 that illustrates relaxation dispersion of various kinds of tissues, in accordance with various embodiments. The plot diagram 200 illustrates relaxation dispersion of various kinds of tissues, as shown in the figure. However, the plot diagram 200 expands on this concept by variances of relaxation times across magnetic field frequencies by comparing healthy versus tumorous tissue for the same tissue type. Referring to FIG. 2, relaxation times of tumorous muscle tissue versus healthy muscle tissue can be compared, likewise with healthy and tumorous spleen tissue. As is readily apparent, the relaxation of a tissue type can be changed by its health (healthy versus tumorous), and those differences converge at higher frequencies (i.e., higher magnetic fields). Therefore, identification of the differences between healthy and tumorous tissue can be enhanced by collecting magnetic resonance images at lower frequencies, or lower magnetic fields.

Figure 3:
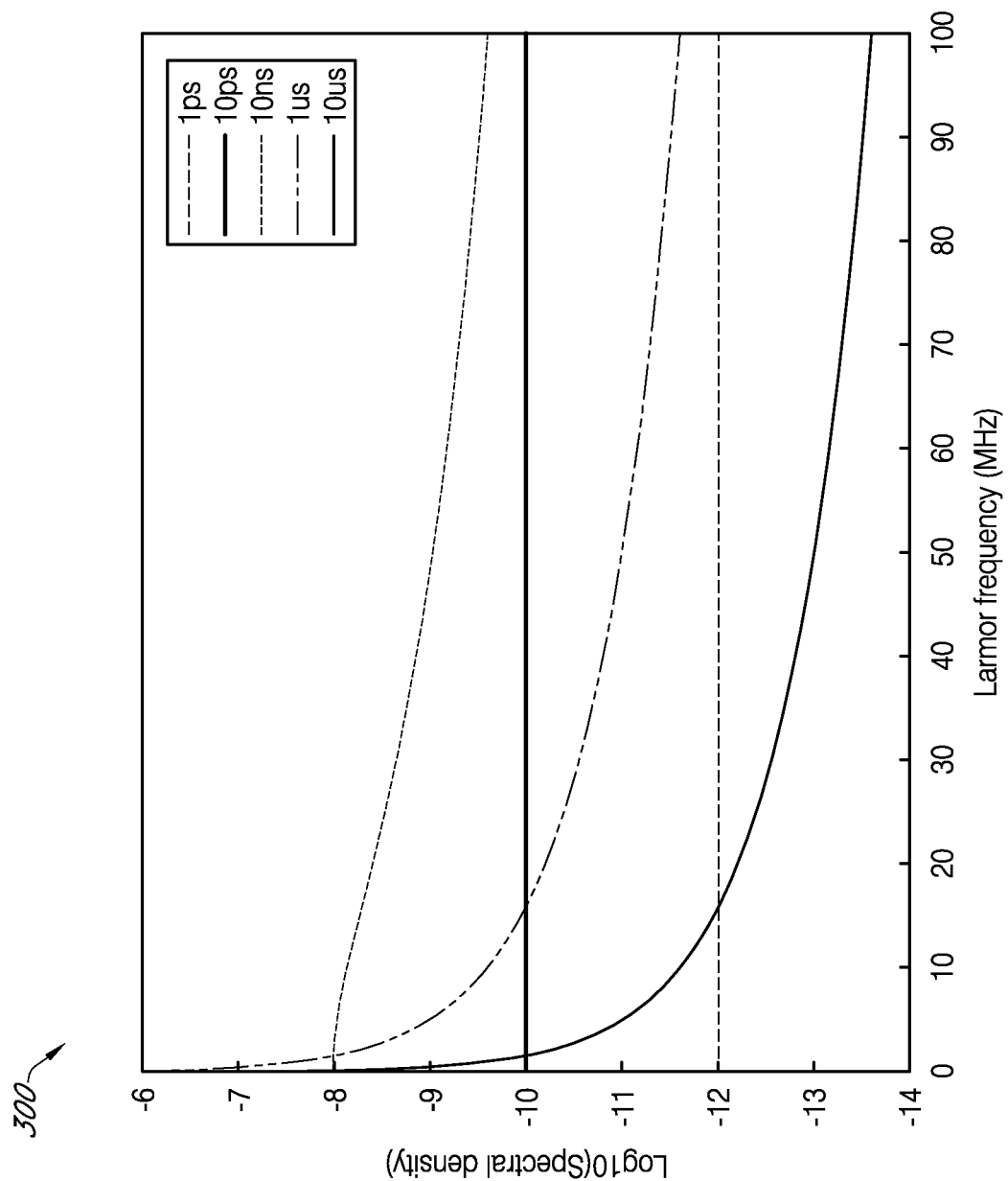
FIG. 3 is a plot diagram that illustrates relaxation dispersion of molecules with various rotational correlation times, in accordance with various embodiments.

FIG. 3 is a plot diagram 300 that illustrates relaxation dispersion of molecules with various rotational correlation times, in accordance with various embodiments. The plot diagram 300 illustrates relaxation rates with differing rotational correlation times, as shown in the figure. Free water molecules have a short correlation time while bound water has a longer correlation time. This results in both the free water having a long relaxation time and that time being consistent across magnetic fields. The relaxation time of bound water, on the other hand, has a steeper dependence on the magnetic field.

As stated above, an MRI system's effectiveness can be strongly correlated with its ability to generate quality contrast in an image, to thereby better distinguish between different kinds of tissues and/or changes within a single kind of tissue. The more that different individual voxels differ in contrast, the more readily a physician can make a diagnosis. The intensity of a voxel in MRI depends, for example, on the relaxation properties of the water in the parts of space associated with that voxel. Voxels with similar relaxation times, depending on the imaging protocol chosen, will have similar intensities. Voxels with different relaxation times will contrast with one another. Many variables contribute to making one voxel differ in intensity from another. Differences in the tissue composition of each voxel, for example, will be a significant contributor to contrast.

There are many existing methods for measuring the relaxation dispersion of samples and patients. The methods can be broadly divided into two types: static field cycling and effective field cycling, both of which are difficult to implement in a conventional MRI scanner.

Static field cycling is the most straightforward method of measuring the relaxation dispersion of a sample or patient. Field cycling is a technique in magnetic resonance where the magnitude of the external field is changed for part of the scan. Field cycling is typically done with an electromagnet that can produce a relatively homogeneous field over a region of interest, a field that can be set to various magnitudes. These devices typically have a single magnetic field that is used for signal acquisition, with the other possible fields being reserved for encoding some information onto the signal.

An example experiment done with field cycling spectrometers can be accomplished in several steps. First, the external magnetic field is ramped up to the highest value that the electromagnet can reach and maintain. This is considered the polarizing field, which increases the nuclear spin polarization of the sample and therefore the signal to noise ratio. Once the sample is polarized, the external magnetic field is ramped down to the value that brings the sample to the desired portion of its relaxation dispersion. Once there, the sample can relax for a while, enough for the signal magnitude of different parts of the sample to diverge due to their different relaxation times. After the sample has been encoded with their relaxation times, the external magnetic field is ramped back up to whichever frequency the resonant radio frequency coil used with the magnet is tuned to. This process is repeated several times, with the encoding field being changed every time, until the entire relaxation dispersion curve is sampled. This method, however, requires a strong electromagnet, designed to rapidly ramp up and down the external magnetic field by several hundred milliTesla (mT).

There also exist methods for cycling the magnitude of the field used for relaxation encoding that do not require changing the external magnetic field. All magnetic resonance imaging (MRI) and nuclear magnetic resonance (NMR) scanners have a tuned radio frequency coil as part of the scanning apparatus. These coils apply resonant magnetic fields to samples, changing the effective strength and orientation of the magnetic field. For example, a conventional MRI will have a static field equal to 3 Tesla (T) and a radio frequency coil that can produce an oscillating magnetic field on the order of tens of microTesla (μT). However, when the radio frequency coil is turned on and set to produce a field oscillating at the Larmor frequency of the sample, the sample will experience an effective field equal to the magnitude of the radio frequency field. The static field will be cancelled by the pulsed radio frequency field. This can be used to measure a kind of relaxation dispersion. The sample or patient can be made to relax at an effective field produced by the radio frequency coil. The magnitude of the radio frequency field can be changed to cycle the field like the field of an electromagnet, allowing one to study the relaxation dispersion of a sample. This requires considerably less hardware changes than installing an electromagnet to a scanner but also has a far more restricted range of fields. For an MRI scanner, the field range will be from 1 to 1000 µT. NMR spectrometers can reach tens of mT.

There are a few other ways to field cycle that are occasionally used. Newer NMR spectrometers generally have the capability to shuttle samples into the fringe field of the magnet. The magnets used with NMR can vary from 7.9 T to 23 T. Each magnet sold with a scanner is said to be at one magnetic field, typically converted to the proton Larmor frequency. However, the magnetic field produced by the superconducting magnet has a strong gradient. This gradient can be referred to as the fringe field, which varies from the stated field of the magnet to Earth's magnetic field as one moves further from the magnet's field of view. Some newer spectrometers have a feature that takes advantage of this fringe field. The spectrometer shuttles the sample from the field of view into the fringe field, where it can relax at a much lower magnetic field. Then, the sample is shuttled back into the field of view for detection.

Another way to field cycle is to simply perform MM scans at different magnetic fields using different scanners. Some facilities may have access to 1T, 3T and 7T scanners (these are generally considered the most common fields). Images of the same part of the body may be collected with each scanner and information about the relaxation dispersion may be deduced from that. While there likely will not be much dispersion identified, since most of it occurs at below 10 MHz, the differences in contrast are noticeable. This however requires considerable time and cost to run multiple scans, and have the resources to purchase and maintain multiple scanners at multiple magnetic field strengths.

As discussed above, and as evidenced by some of the known exemplary methods discussed above, producing a magnetic field cycled Mill with conventional means is typically infeasible. For Mill systems, a potentially effective method of producing different magnetic fields is the process of spin locking.

Spin locking can be produced when magnetization is kept along the same axis as an applied, resonant magnetic field. This can be done by applying a radio frequency pulse along the same axis as the magnetization. This in turn can prevent transverse magnetization from acquiring phase so long as the spin locking pulse is applied. This also alters the relaxation properties of the spin locked magnetization. The relaxation properties of the magnetization are altered in two ways, one of which is relevant to a low field system. The relevant change to relaxation is that the spin locked magnetization will relax as if it were in a static field equal in magnitude to the oscillating field used for spin locking. As radio frequency pulses are typically in the microTesla (µT), and fields used for polarization are typically tens of milliTesla (mT) to tens of Tesla, spin locking allows one to make tissue relax at a field where contrast is much greater than would otherwise be accessible. The relaxation time measured with a spin locking pulse is called T1rho.

The majority of MRI systems can spin lock portions of tissue but doing so it not always practical. Moreover, current MRI systems can at times effectively spin lock excised tissues, as opposed to tissue in vivo. Spin locking requires that magnetization be affected by a magnetic field greater than any offset the tissue may experience. At high fields, the strength needed to spin lock may be greater than specific absorption rates (SAR) standards allow, therefore exposing enormous amounts of energy to the human body during an MRI scan. The higher the external magnetic field, the more energy is deposited by the radio frequency coil. The scaling of SAR is shown below:

$$SAR \propto B_0^2 \theta \Delta f$$

SAR=specific absorption rate $B_0$=External magnetic field $\Delta f$=pulse bandwidth Again, as discussed above, and as evidenced by some of the known exemplary methods discussed above, producing a magnetic field cycled MRI with conventional means is typically infeasible. For MRI systems, another potentially effective method of producing different magnetic fields is provide inserts (or peripherals) in the bore of an MRI scanner, the bore being, for example, the opening in a whole-body MRI scanner that houses the patient during the scanning process, or the opening in a portable or point-of-care scanner that houses a specific body part.

Applicants have found that providing a specific MM (or spectrometer) design (e.g., single-sided MRI design) for a low magnetic field MRI scanner can facilitate field cycling to improve image contrast via effective spin locking. As such, spin locking can occur without exposing the body to the enormous amounts of energy commensurate with such a spin locking method in standard MRI machines, amounts of which can often exceed SAR standards as discussed above. Applicants have further found that providing a specific MRI (or spectrometer) design (e.g., single-sided MRI design) for a low magnetic field MRI scanner can allow for effective addition of inserts or peripherals into the bore at a distance close enough to also assist in field cycling to improve image contrast.

Figure 4:
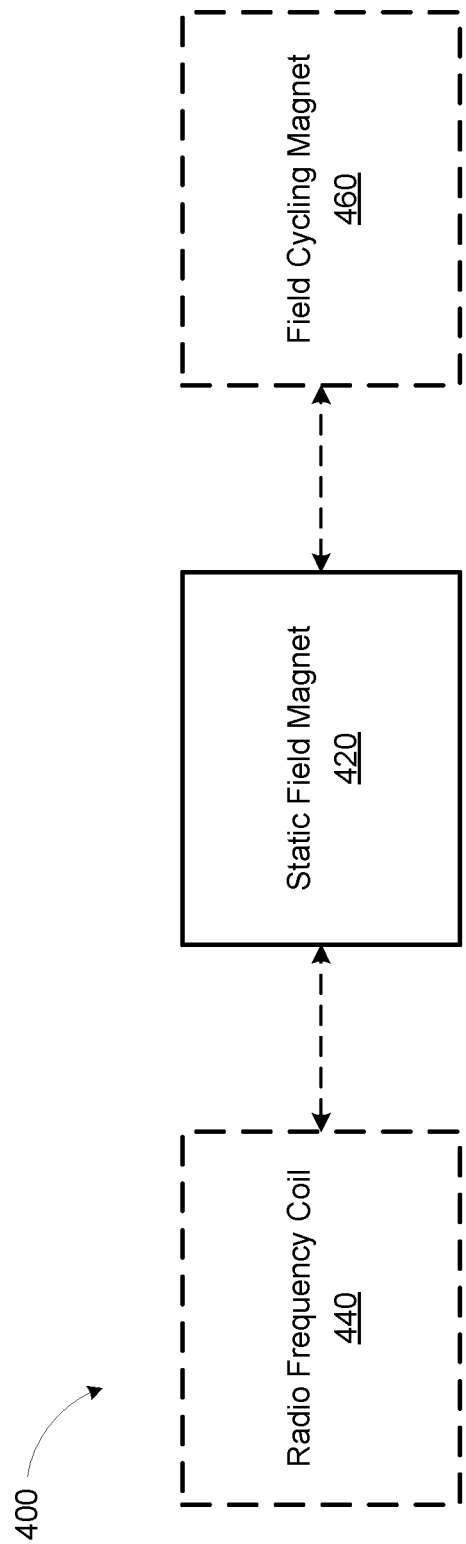
FIG. 4 is a schematic illustration of a field cycled magnetic resonance system, in accordance with various embodiments.

FIG. 4 is a schematic illustration of a field cycled magnetic resonance system 400, according to various embodiments. In accordance with various embodiments, the system 400 can be a single-sided magnetic resonance imaging system. In accordance with various embodiments, the system 400 can include a magnetic resonance imaging scanner or a magnetic resonance imaging spectrometer. As shown in FIG. 4, the system 400 includes a static field magnet 420. In accordance with various embodiments, the static field magnet 420 can be configured to image a tissue sample within a given field of view. In accordance with various embodiments, the tissue sample can be any anatomical portion of a person being examined. In accordance with various embodiments, the static field magnet 420 can include a plurality of cylindrical permanent magnets in parallel configuration. In accordance with various embodiments, the static field magnet 420 can include a bore in its center. In accordance with various embodiments, the static field magnet 420 may not include a bore. In accordance with various embodiments, the bore can have a diameter between 1 inch and 20 inches. In accordance with various embodiments, the bore can have a diameter between 1 inch and 4 inches, between 4 inches and 8 inches, and between 10 inches and 20 inches. In accordance with various embodiments, the given field of view can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches.

As shown in FIG. 4, the system 400 can include a radio frequency coil 440. In accordance with various embodiments, the radio frequency coil 440 can be configured to produce cycling radio frequency field. In accordance with various embodiments, the radio frequency coil 440 can be used for spin locking. In accordance with various embodiments, the radio frequency coil 440 can be configured for applying pulsed cycling radio frequency field to the low static external magnetic field. In accordance with various embodiments, the cycling radio frequency field can range from 1 µT to 1 mT. In accordance with various embodiments, the cycling radio frequency field can range from 100 µT to 900 µT.

As shown in FIG. 4, the system 400 can include a field cycling magnet 460. In accordance with various embodiments, the field cycling magnet 460 can be disposed proximate to the low static external magnetic field. In accordance with various embodiments, the field cycling magnet 460 can be disposed proximate to the static field magnet 420. For example, the field cycling magnet 460 can be disposed in front, back, or middle of the static field magnet 420. In accordance with various embodiments, the field cycling magnet 460 can be concentric with the static field magnet 420. In accordance with various embodiments, the field cycling magnet 460 can be an electromagnet, a permanent magnet that is configured to move relative to the main magnet, or a permanent magnet comprising a ferromagnetic or magnetizable material that adjusts and shapes the low static external magnetic field. In accordance with various embodiments, the field cycling magnet 460 can be a solenoid coil configured to create a field that either adds or subtracts from the field generated by the static field magnet, allowing for relaxation encoding at different fields.

In accordance with various embodiments, the field cycling magnet 460 can include an opening in center of the magnet. In accordance with various embodiments, the field cycling magnet 460 can be a donut shape ring, a cylindrical shape ring, or an oval shape ring. In accordance with various embodiments, the field cycling magnet 460 can include a plurality of magnets that are arranged in a ring configuration, or any other suitable shape or configuration having the plurality of magnets formed around a circumference. In accordance with various embodiments, the field cycling magnet 460 can have a magnetic field strength from 0.5 mT to 1 T. In accordance with various embodiments, the field cycling magnet 460 can have a magnetic field strength from 5 mT to 195 mT.

Figure 5A:
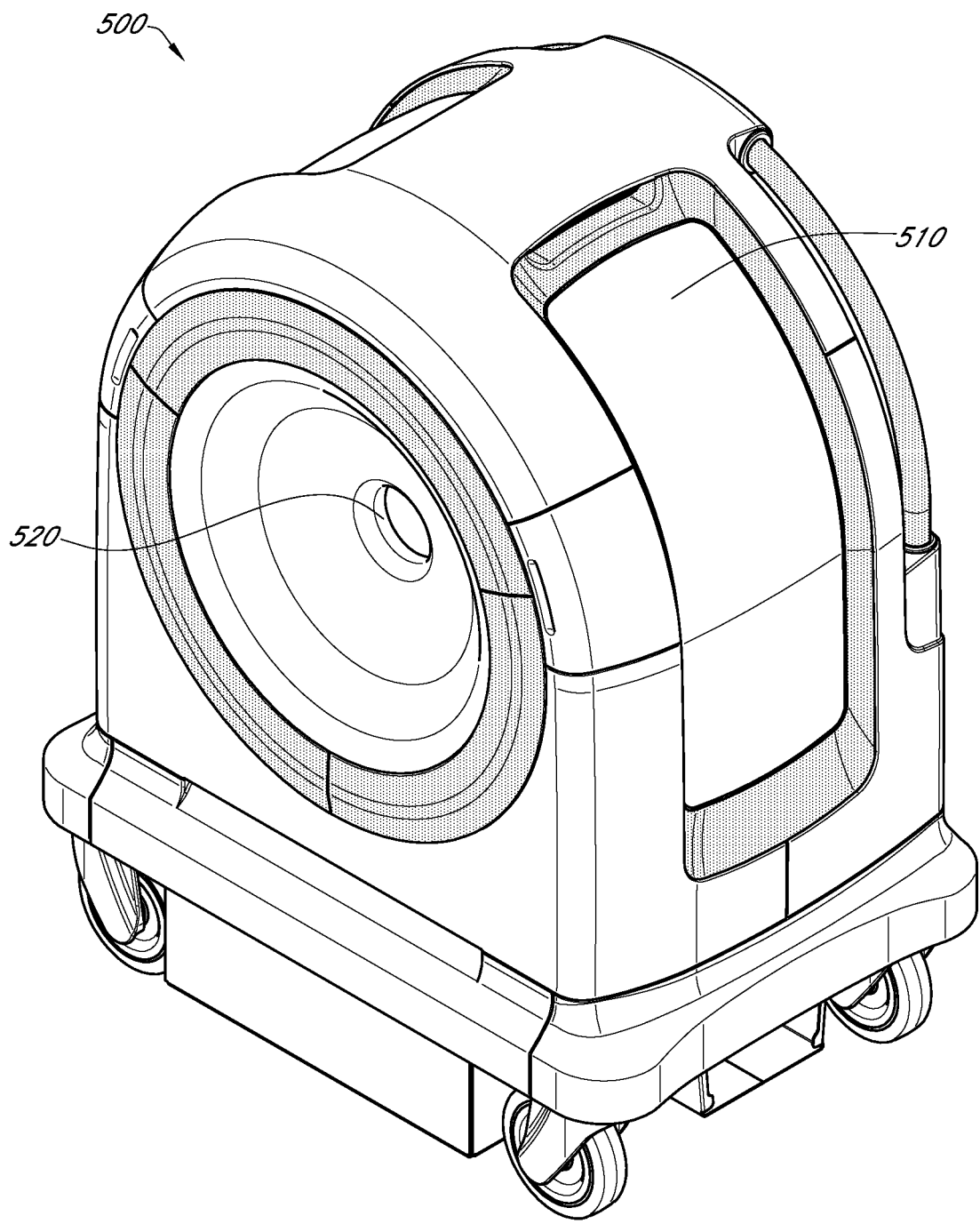
FIGS. 5A and 5B illustrate perspective views of an example field cycled magnetic resonance system 500, in accordance with various embodiments.
Figure 5B:
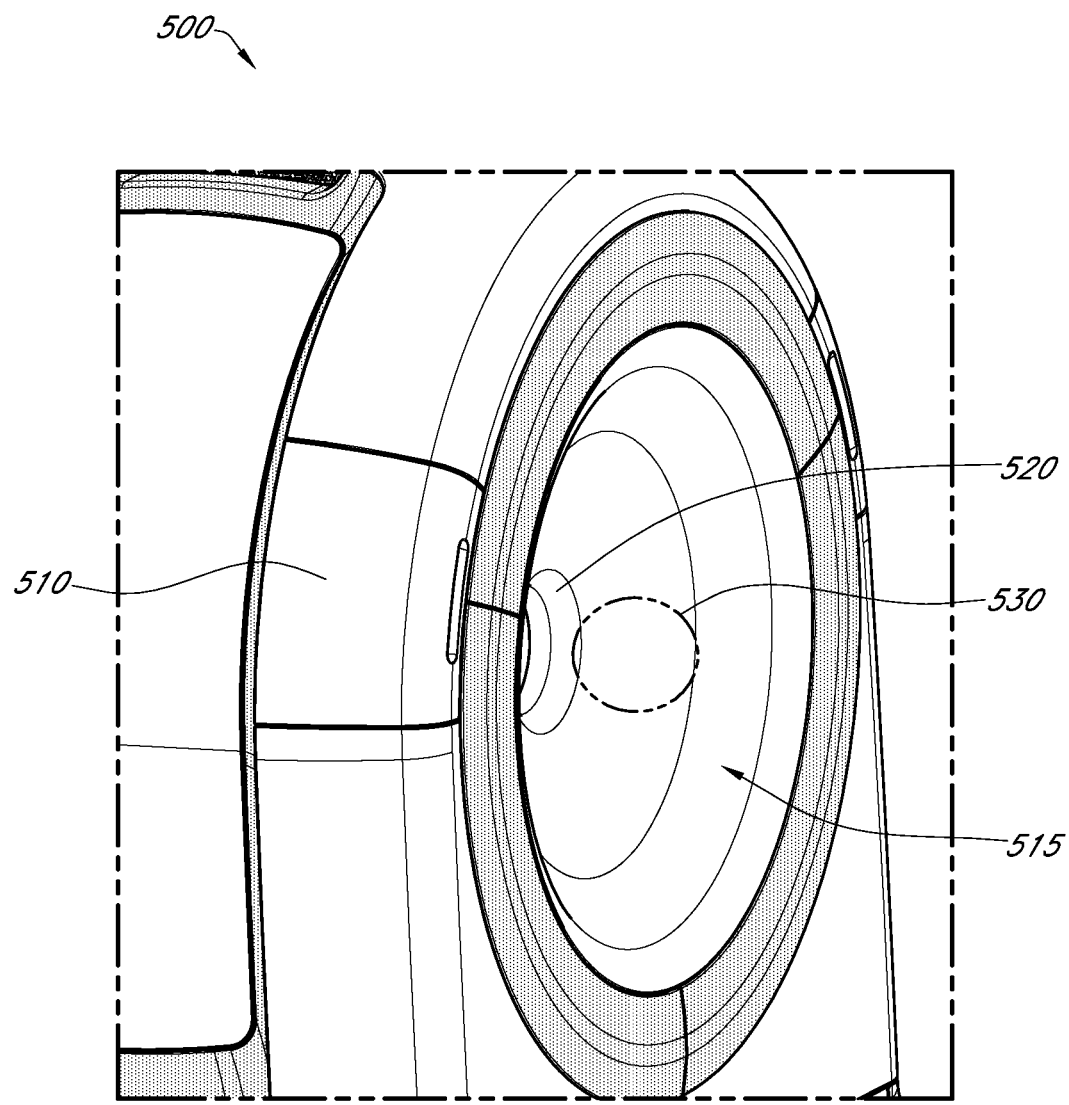

FIGS. 5A and 5B illustrate perspective views of an example field cycled magnetic resonance system 500, in accordance with various embodiments. In accordance with various embodiments, the system 500 can be any MRI system, including for example, a single-sided magnetic resonance imaging system that comprises a magnetic resonance imaging scanner or a magnetic resonance imaging spectrometer, as disclosed herein.

As shown in FIGS. 5A and 5B, the system 500 includes a housing 510 that can house various components, including, for example but not limited to, magnets, electromagnets, coils for producing radio frequency fields, various electronic components, for example but not limited to, for controlling, powering, and/or monitoring of the system 500. In accordance with various embodiments, the housing 510 can house, for example, the static field magnet 420, the radio frequency coil 440, and/or the field cycling magnet 460 within the housing 510. In accordance with various embodiments, the system 500 also includes a bore 520 at its center of the magnetic components, such as, for example, the static field magnet 420, the radio frequency coil 440, and/or the field cycling magnet 460. In accordance with various embodiments, the field cycling magnet 460 can be inserted in the bore 520. In accordance with various embodiments, the field cycling magnet 460 can be placed proximate to the bore 520. For example, the field cycling magnet 460 can be placed in front, back or middle of the bore 520. In accordance with various embodiments, the field cycling magnet 460 can be placed proximate to, or at the entrance of the bore 520. In accordance with various embodiments, the bore 520 can have a diameter between 1 inch and 20 inches. In accordance with various embodiments, the bore 520 can have a diameter between 1 inch and 4 inches, between 4 inches and 8 inches, and between 10 inches and 20 inches. In accordance with various embodiments, the system 500 may not include a bore.

In accordance with various embodiments, the system 500 can be configured to image a tissue sample within a given field of view 530 as shown in FIG. 5B. In accordance with various embodiments, the given field of view 530 is a three dimension (3D) volumetric space where the tissue sample, including but not limited to any anatomical portion of a person, is being examined, evaluated, and/or imaged. In accordance with various embodiments, the given field of view 530 can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches. In accordance with various embodiments, the magnetic components, such as, for example, the static field magnet 420, the radio frequency coil 440, and/or the field cycling magnet 460 are configured to generate and/or enhance during examination, evaluation, and/or imaging in the given field of view 530.

As shown in FIG. 5B, the given field of view 530 resides near a surface 515 proximate to, or in front of, the bore 520 of the system 500. In accordance with various embodiments, the surface 515 can be curved, flat, concave, convex, or otherwise have a curvilinear surface.

Figure 6A:
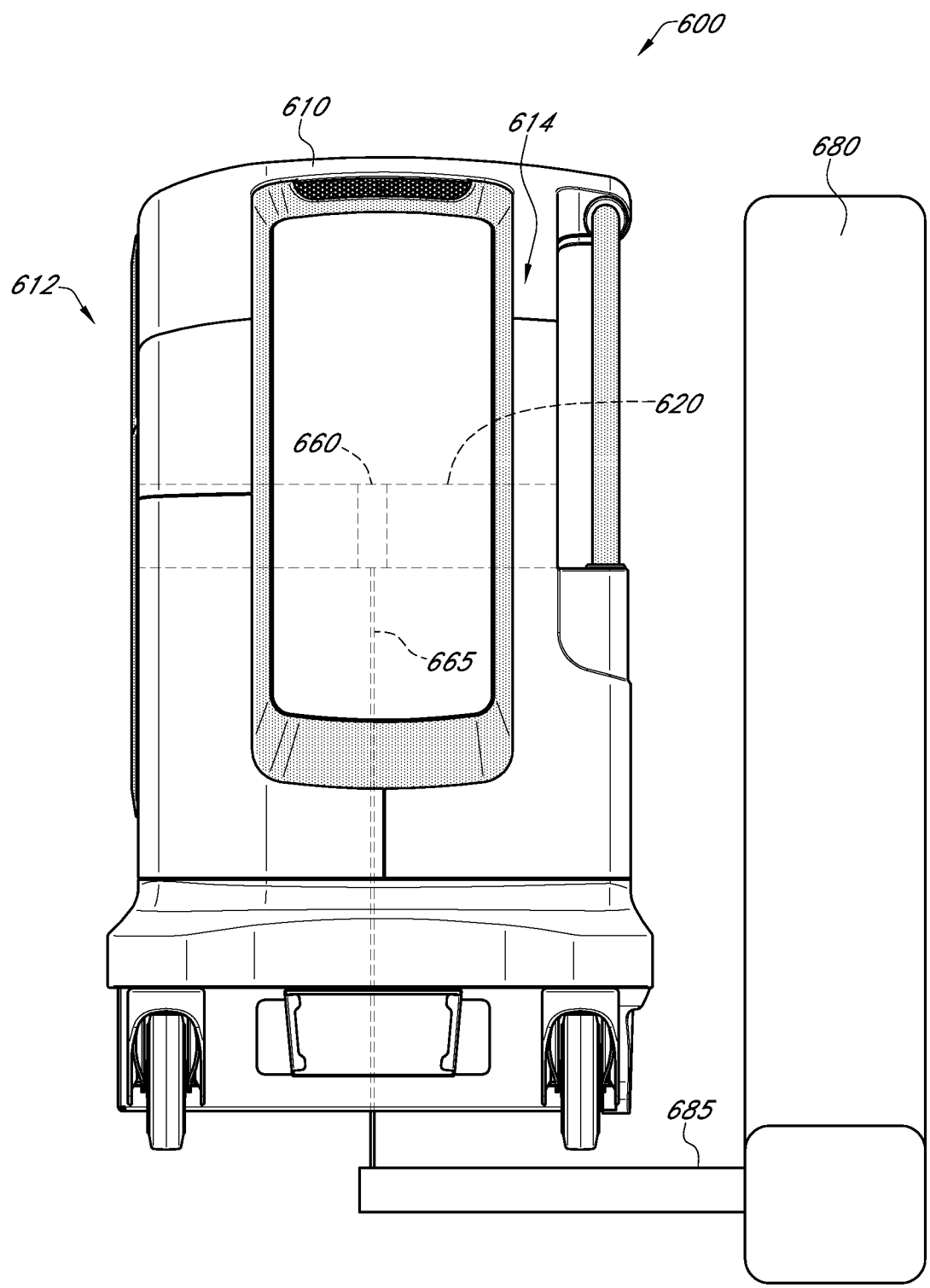
FIG. 6A illustrates a side view of an example field cycled magnetic resonance system, in accordance with various embodiments.
Figure 6B:
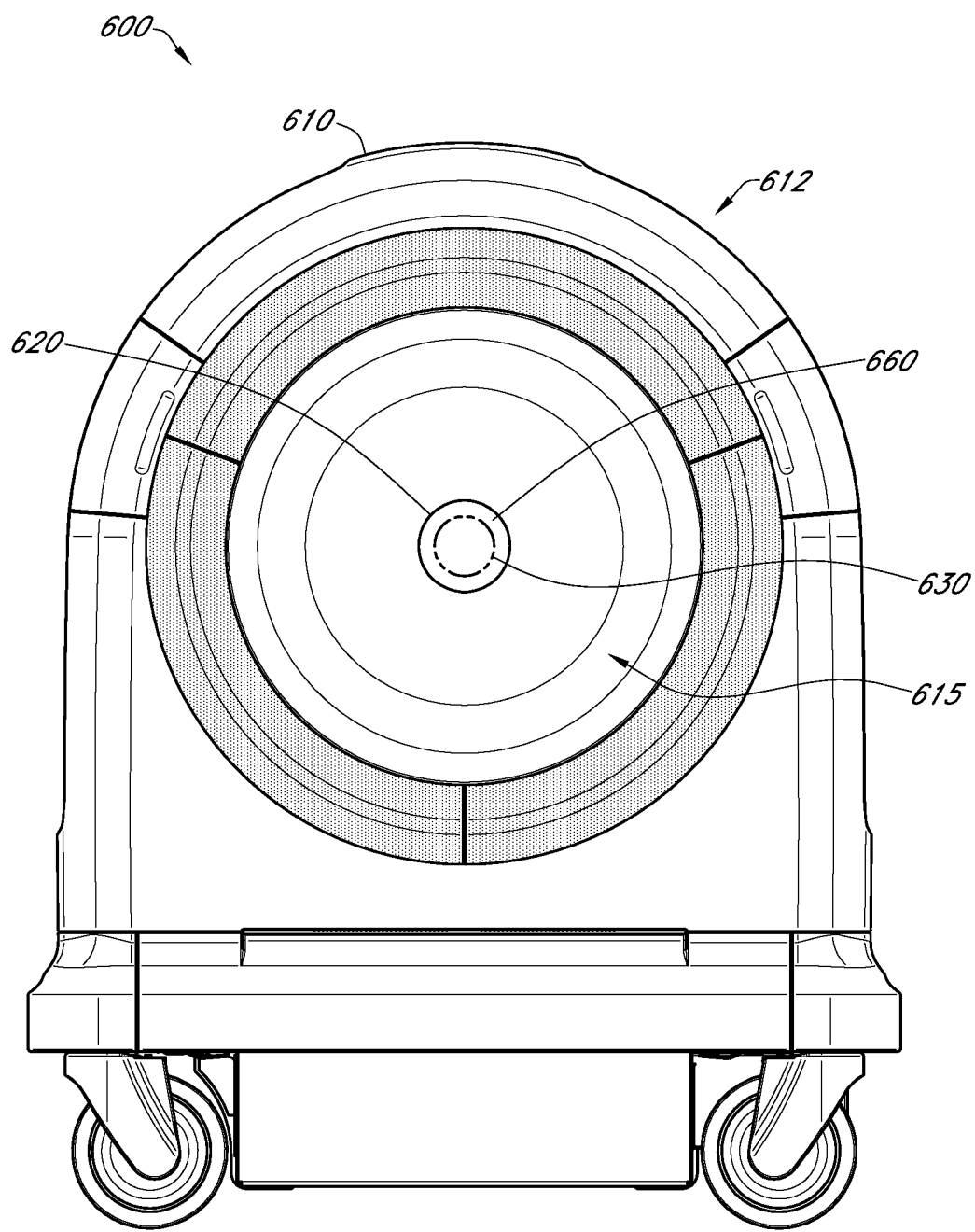
FIG. 6B illustrates a front view of the example magnetic resonance imaging system of FIG. 6A, in accordance with various embodiments.

FIG. 6A illustrates a side view of an example field cycled magnetic resonance system 600, in accordance with various embodiments. FIG. 6B illustrates a front view of the example magnetic resonance imaging system 600. In accordance with various embodiments, the system 600 can be any MRI system, including for example, a single-sided magnetic resonance imaging system that comprises a magnetic resonance imaging scanner or a magnetic resonance imaging spectrometer, as disclosed herein.

As shown in FIGS. 6A and 6B, the system 600 includes a housing 610 that can house various components, including, for example but not limited to, magnets, electromagnets, coils for producing radio frequency fields, various electronic components, for example but not limited to, for controlling, powering, and/or monitoring of the system 600. In accordance with various embodiments, the housing 610 can house, for example, the static field magnet 420 and/or the radio frequency coil 440 within the housing 610. In accordance with various embodiments, the system 600 also includes a bore 620 in its center. As shown in FIGS. 6A and 6B, the housing 610 also includes a front 612, a back 614, and a surface 615 of the system 600. In accordance with various embodiments, the surface 615 can be curved, flat, concave, convex, or otherwise have a curvilinear surface.

In accordance with various embodiments, the system 600 can be configured to image a tissue sample within a given field of view 630 as shown in FIG. 6B. In accordance with various embodiments, the given field of view 630 is a three dimension (3D) volumetric space where the tissue sample, including but not limited to any anatomical portion of a person, is being examined, evaluated, and/or imaged. In accordance with various embodiments, the given field of view 630 can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches.

As shown in FIGS. 6A and 6B, the system 600 includes a field cycling magnet 660 disposed on the front 612 and near the surface 615 of the system 600. In accordance with various embodiments, the field cycling magnet 660 is disposed proximate to the center of the surface 615 on the front 612 of the system 600. In accordance with various embodiments, the field cycling magnet 660 can be an electromagnet, a permanent magnet that is configured to move relative to the main magnet, or a permanent magnet comprising a ferromagnetic or magnetizable material that adjusts and shapes the low static external magnetic field. In accordance with various embodiments, the field cycling magnet 660 can be a solenoid coil configured to create a field that either adds or subtracts from the field generated by the static field magnet, allowing for relaxation encoding at different fields.

As shown in FIG. 6B, the given field of view 630 resides at the center of the surface 615 at the front 612 of the system 600. In accordance with various embodiments, the field cycling magnet 660 is disposed within the given field of view 630. In accordance with various embodiments, the field cycling magnet 660 is disposed concentrically with the given field of view 630. In accordance with various embodiments, the field cycling magnet 660 can be inserted in the bore 620. In accordance with various embodiments, the field cycling magnet 660 can be placed proximate to the bore 620. For example, the field cycling magnet 660 can be placed in front, back or middle of the bore 620. In accordance with various embodiments, the field cycling magnet 660 can be placed proximate to, or at the entrance of the bore 620.

As shown in FIG. 6A, the system 600 also includes a rack 680 for housing various ancillary components, such as, for example, a computer configured for controlling the system 600, one or more power supplies, data acquisition equipment, etc. As shown in FIG. 6A, the system 600 also includes a conduit 685 for connecting various components in the housing 610 to the various components housed inside the rack 680. As shown in FIG. 6A, the field cycling magnet 660 is connected to the conduit 685 via a connection 665. In accordance with various embodiments, the connection 665 can be any suitable power cable that is shielded from the magnets.

In accordance with various embodiments, a magnetic resonance system (also referred to herein as field cycled magnetic resonance system) is provided that includes a static field magnet (e.g., static field magnet 420) configured to provide a low static external magnetic field. The magnetic field may vary from about 50 mT to about 60 mT, about 45 mT to about 65 mT, about 40 mT to about 70 mT, about 35 mT to about 75 mT, about 30 mT to about 80 mT, about 25 mT to about 85 mT, about 20 mT to about 90 mT, about 15 mT to about 95 mT and about 10 mT to about 100 mT to a given field of view. The magnetic field may also vary from about 10 mT to about 15 mT, about 15 mT to about 20 mT, about 20 mT to about 25 mT, about 25 mT to about 30 mT, about 30 mT to about 35 mT, about 35 mT to about 40 mT, about 40 mT to about 45 mT, about 45 mT to about 50 mT, about 50 mT to about 55 mT, about 55 mT to about 60 mT, about 60 mT to about 65 mT, about 65 mT to about 70 mT, about 70 mT to about 75 mT, about 75 mT to about 80 mT, about 80 mT to about 85 mT, about 85 mT to about 90 mT, about 90 mT to about 95 mT, and about 95 mT to about 100 mT. In accordance with various embodiments, the magnetic field may also vary from about 10 mT to about 1 T, about 15 mT to about 900 mT, about 20 mT to about 800 mT, about 25 mT to about 700 mT, about 30 mT to about 600 mT, about 35 mT to about 500 mT, about 40 mT to about 400 mT, about 45 mT to about 300 mT, about 50 mT to about 200 mT, about 50 mT to about 100 mT, about 45 mT to about 100 mT, about 40 mT to about 100 mT, about 35 mT to about 100 mT, about 30 mT to about 100 mT, about 25 mT to about 100 mT, about 20 mT to about 100 mT, and about 15 mT to about 100 mT.

In accordance with various embodiments, the magnetic resonance system is an MRI scanner or spectrometer.

In accordance with various embodiments, the field of view is a spherical or cylindrical field of view. In various embodiments, the field of view is approximately 4 inches in diameter and/or 4 inches in length. Fields of view for diameter and lengths may vary from about 10 to about 11 inches, about 9 to about 12 inches, about 8 to about 13 inches, about 7 to about 14 inches, about 6 to about 15 inches, about 5 to about 16 inches, about 4 to about 17 inches, about 3 to about 18 inches, about 2 to about 19 inches, about 1 to about 20 inches, about 1 to about 30 inches, and about 1 to about 40 inches. Fields of view for diameter and lengths may also vary from about 1 to about 2 inches, about 2 to about 3 inches, about 3 to about 4 inches, about 4 to about 5 inches, about 5 to about 6 inches, about 6 to about 7 inches, about 7 to about 8 inches, about 8 to about 9 inches, about 9 to about 10 inches, about 10 to about 11 inches, about 11 to about 12 inches, about 12 to about 13 inches, about 13 to about 14 inches, about 14 to about 15 inches, about 15 to about 16 inches, about 16 to about 17 inches, about 17 to about 18 inches, about 18 to about 19 inches, about 19 to about 20 inches, about 3 to about 5 inches, about 2 to about 6 inches, about 1 to about 7 inches, about 1 to about 5 inches, and about 1 to about 4 inches.

In accordance with various embodiments, the system is configured to apply field cycling to the low static external magnetic field emitted by the magnet. In various embodiments, the system is configured to provide field cycling to the low static external magnetic field provided by the magnet by applying a spin locking field, wherein the spin locking field spin locks the magnetization emitted by the magnet with a radio frequency pulse. In various embodiments, the system is configured to provide field cycling to the low static external magnetic field emitted by the magnet by further including a peripheral (e.g., field cycling magnet) to alter the static magnetic field within the given field of view. Spin locking can be performed when the peripheral is not active. In various embodiments, the low magnetic field imparted is substantially below SAR standards. In various embodiments, the system is a single-sided MRI system.

In accordance with various embodiments, while the above notes a magnetic resonance system configured to, for example, field cycle the external magnetic field using, for example, spin locking or adding inserts (e.g., a peripheral, such as, field cycling magnet as described herein) to the magnet (e.g., static field magnet), this disclosure also contemplates a method for imaging tissue within a field of view. The method can comprise, for example, providing a magnetic resonance system comprising a magnet, providing a tissue sample within the field of view, applying a low static external magnetic field to a given field of view, field cycling that low static external magnetic field, and collecting images from the system. The field cycling can further include applying a spin locking field and/or applying an insert or peripheral to the magnet. Spin locking may be done by continuously applying a field on resonance to the Larmor frequency of the desired slice after excitation. If the spin locking field is colinear with the magnetization, then the magnetization will be spin locked. This requires only the transmission coil.

By spin locking at the low magnetic fields provided by the system, with the magnitude and duration of the field not limited by SAR do to the low level of external field, the magnetic resonance system can perform a relaxation dispersion experiment on tissue without cycling the external field. While the external field may be static, the strength of the spin locking field can be varied. The system can apply spin locking fields ranging from about 450 µT to about 550 µT, about 400 µT to about 600 µT, about 350 µT to about 650 µT, about 300 µT a to about 700 µT, about 250 µT to about 750 µT, about 200 µT to about 800 µT, about 150 µT to about 850 µT, about 100 µT to about 900 µT, about 50 µT to about 950 µT, about 10 µT to about 990 µT, and about 1 µT to about 1 mT. Ranges of spin locking fields can also range from about 1 µT to about 50 µT, about 50 µT to about 100 µT, about 100 µT to about 150 µT, about 150 µT to about 200 µT, about 200 µT to about 250 about 250 µT to about 300 about 300 µT to about 350 about 350 µT to about 400 µT, about 450 µT to about 500 µT, about 500 µT to about 550 about 550 µT to about 600 µT, about 600 µT to about 650 µT, about 650 µT to about 700 µT, about 700 µT to about 750 µT, about 750 µT to about 800 µT about 800 µT to about 850 µT, about 850 µT to about 900 µT, about 900 µT to about 950 µT, and about 950 µT to about 1 mT. In accordance with various embodiments, the system can apply spin locking fields from about 0.5 µT to about 1 mT.

This spin locking regime allows one to change the contrast of an image by changing the strength of the spin locking field. By performing multiple spin locking experiments, one can extract a rotational correlation time by fitting the relaxation times collected to a simple model. This allows one to gain greater insight into tissue by studying it under many different conditions. Changes to tissue associated with cancer, like increases in cellularity, can be made visible by changing the relaxation dynamics of a system without major hardware changes. A distribution of a plurality of relaxation times, instead of just a binary time value T1 and time value T2, become available to the radiologist with spin locking relaxation dispersion.

There are numerous advantages to spin locking at lower magnetic fields besides that disclosed above. For example, at high magnetic fields, there are at least two major contributions to relaxation during a period of spin locking: relaxation due to dipolar coupling and relaxation due to chemical exchange. The chemical exchange contribution increases with the square of the external magnetic field. The stronger the field, the more chemical exchange contribution dominates T1rho relaxation (the relaxation time measured with a spin locking pulse). At lower magnetic fields, the chemical exchange contribution to T1rho relaxation is quenched. As a result, if one is interested in using spin locking to collect a dipolar relaxation dispersion, doing so at high magnetic fields will be difficult because the dispersion will be mixed with chemical exchange contributions to relaxation. Even sampling lower fields at high static magnetic fields with spin locking becomes extremely difficult because the contribution from chemical exchange also scales with the magnitude of the spin locking field.

In accordance with various embodiments, the magnetic resonance system can further include or can be configured to receive an insert or peripheral. In accordance with various embodiments, the insert or peripheral is an electromagnet. The electromagnet may be, for example, an air core, a ferromagnetic core, or a dielectric core. As stated above, due to, for example, the low static magnetic field, it is much more feasible to change the static field of the system with an electromagnet. Unlike a superconducting magnet used for conventional MRI, the system herein has a much weaker permanent field. Bringing the hardware necessary for a powerful electromagnet, hardware which may have ferromagnetic components, close to the system herein is considerably safer than bringing a similar device close to a superconducting magnet. Furthermore, as discussed above and illustrated, for example, in FIGS. 4, 5A, 5B, 6A, and 6C, the field of view can be provided on the surface of the magnet, rather than the bore, allowing for much easier access. A similar device (insert or peripheral) would need to be placed into the bore of a conventional MRI, where there is already not enough room and, in many cases, may be occupied by a patient. Therefore, an electromagnet can be incorporated into the system to change the static field. The electromagnet can reduce the static field in field of view, where tissue to relax at fields where the relaxation times of different tissues differ the most. This could, in certain circumstances, allow for a wider range of fields than spin locking.

The range of fields accessible with a field cycling magnet (e.g., field cycling magnet 420), assuming it is designed to either lower the static field or raise it. In accordance with various embodiments, the range of fields accessible with the field cycling magnet can be from about 95 mT to about 105 mT, about 90 mT to about 110 mT, about 85 mT to about 115 mT, about 80 mT to about 120 mT, about 75 mT to about 125 mT, about 70 mT to about 130 mT, about 65 mT to about 135 mT, about 60 mT, to about 140 mT, about 55 mT to about 145 mT, about 50 mT to about 150 mT, about 45 mT to about 155 mT, about 40 mT to about 160 mT, about 35 mT to about 165 mT, about 30 mT to about 170 mT, about 25 mT to about 175 mT, about 20 mT to about 180 mT, about 15 mT to about 185 mT, about 10 mT to about 190 mT, about 5 mT to about 195 mT, and about 0.5 mT to about 200 mT. The range of fields accessible with a field cycling magnet, assuming it is designed to either lower the static field or raise it, can also be from about 0.5 mT to about 10 mT, about 10 mT to about 20 mT, about 20 mT to about 30 mT, about 30 mT to about 40 mT, about 40 mT to about 50 mT, about 50 mT to about 60 mT, about 60 mT to about 70 mT, about 70 mT to about 80 mT, about 80 mT to about 90 mT, about 90 mT to about 100 mT, about 100 mT to about 110 mT, about 110 mT to about 120 mT, about 120 mT to about 130 mT, about 130 mT to about 140 mT, about 140 mT to about 150 mT, about 150 mT to about 160 mT, about 160 mT to about 170 mT, about 170 mT to about 180 mT, about 180 mT to about 190 mT and about 190 mT to about 200 mT. In accordance with various embodiments, range of fields accessible with a field cycling magnet, assuming it is designed to either lower the static field or raise it, can be from about 0.5 mT to about 1 T, about 5 mT to about 900 mT, about 10 mT to about 800 mT, about 20 mT to about 700 mT, about 30 mT to about 600 mT, about 35 mT to about 500 mT, about 40 mT to about 400 mT, about 45 mT to about 300 mT, about 50 mT to about 200 mT, about 50 mT to about 100 mT, about 40 mT to about 200 mT, about 40 mT to about 100 mT, about 30 mT to about 200 mT, about 30 mT to about 100 mT, about 20 mT to about 200 mT, about 20 mT to about 100 mT, about 10 mT to about 200 mT and about 10 mT to about 100 mT.

In accordance with various embodiments, the field cycling magnet would not produce a homogeneous field. No image encoding would be done while the field cycling magnet is turned on. The field cycling magnet would shift the external field slowly enough to fulfil the adiabatic condition. In accordance with certain embodiments, the magnetic resonance system can be configured to provide field cycling to the low static external magnetic field provided by the magnet by applying both a spin locking field and receiving an insert or peripheral. In accordance with certain embodiments, the magnetic resonance system can be configured to provide field cycling to the low static external magnetic field provided by the magnet by applying either a spin locking field or receiving an insert or peripheral.

In accordance with various embodiments, the field cycling magnet can be in the form of a donut shape ring, a cylindrical shape ring, an oval shape ring, or any other suitable shape or form with an opening in the magnet. In accordance with various embodiments, the field cycling magnet can include a set of magnets that are arranged in the form of a ring or any other suitable shape or form around a circumference. In accordance with various embodiments, the field cycling magnet is disposed proximate to, e.g., in front, back, or middle of the magnet. In accordance with various embodiments, the field cycling magnet is concentric with the magnet. The field cycling magnet may also be placed around the patient.

Possible applications for an MRI scanner capable of field cycling include, for example, multimodal imaging. Conventional MRI scanners have a few kinds of contrast available. Typically, kinds of contrast include, T1, T2, T1rho (under special circumstances), and diffusion. A field cycling MRI scanner could have a range of T1 and T1rho contrasts available. If no contrast is visible at one field, the user may change the field and try again. Another application of this technology is, for example, allowing a user to collect a form of contrast dispersion image. A contrast dispersion image could be an image collected repeatedly with different relaxation encoding fields. Tissue could be characterized by how their contrast varies as a function of field. The image analyzed could then be one where the value of each voxel was one extracted from a fit of the amplitude variation as a function of field strength. The value of this fit could roughly correspond to the rotational correlation time of water in that pixel. A series of images would be generated with a non-linear reconstruction, one for each field strength used for relaxation encoding. The value of each pixel of these images would be fit with a simple model that describes relaxation as a function of the external magnetic field, similar to the models used for describing paramagnetic enhancement of relaxation. One may do this by using a model where each pixel in the image is assumed to have two exchanging pools of water. One pool would be the slowly relaxing free water and the other would be the rapidly relaxing bound water. These two pools would mix at a characteristic exchange rate. The parameters that describe relaxation using this simple model, the rotational correlation time of the free and bound water and the exchange rate between them, would be found by fitting the data to the model.

$$R_{1P} = \frac{P_m}{\tau_m + T_{1m}}$$

$$R_{1m} = b^2 \times \frac{\tau_r}{1 + (\tau_r \omega_0)^2}$$

Figure 7:
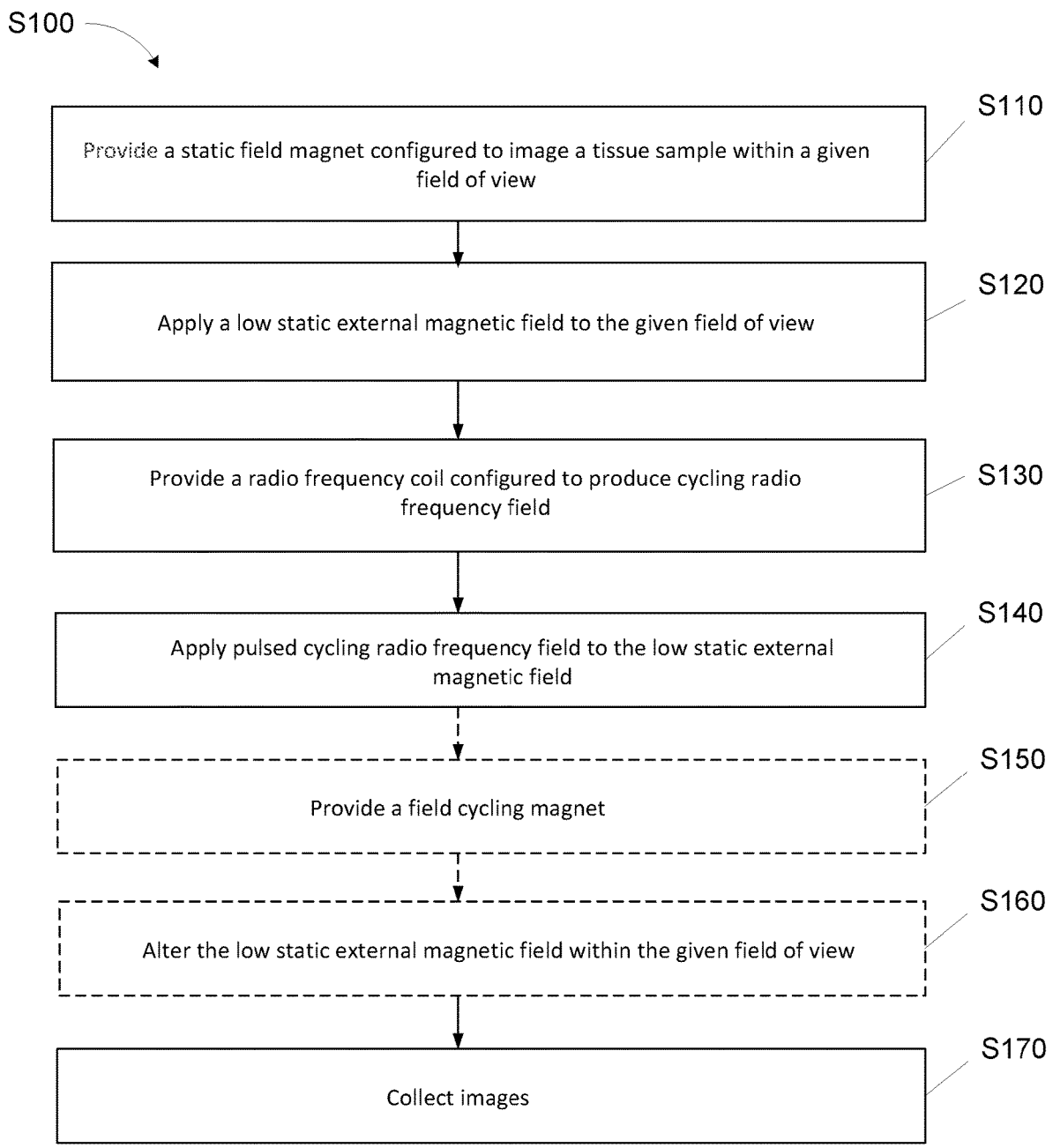
FIG. 7 is a flowchart for an example method of operating a field cycled magnetic resonance system, in accordance with various embodiments.

$P_m$=bound fraction of water
$\tau_m$=Exchange time
$T_{1m}$=Relaxation time of bound water
$R_{1p}$=Increased relaxation rate of water
$R_{1m}$=relaxation rate of bound water
b=dipolar coupling amplitude of bound water to surrounding spins
$\tau_r$=rotational correlation time of bound water
$w_0$=Larmor frequency FIG. 7 is a flowchart for an example method S100 of operating a field cycled magnetic resonance system (e.g., systems 400, 500, or 600), according to various embodiments. In accordance with various embodiments, the magnetic resonance system is a single-sided magnetic resonance imaging system that comprises a magnetic resonance imaging scanner or a magnetic resonance imaging spectrometer. As shown in FIG. 7, the method S100 includes at step S110 providing a static field magnet configured to image a tissue sample within a given field of view. In accordance with various embodiments, the tissue sample can be any anatomical portion of a person being examined. In accordance with various embodiments, the static field magnet can include a plurality of cylindrical permanent magnets in parallel configuration. In accordance with various embodiments, the static field magnet comprises a bore in its center. In accordance with various embodiments, the bore can have a diameter between 1 inch and 20 inches. In accordance with various embodiments, the bore can have a diameter between 1 inch and 4 inches, between 4 inches and 8 inches, and between 10 inches and 20 inches. In accordance with various embodiments, the given field of view can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches.

As shown in FIG. 7, the method S100 includes at step S120 applying a low static external magnetic field to the given field of view. In accordance with various embodiments, the low static magnetic field can range from 10 mT to 1 T. In accordance with various embodiments, the low static magnetic field can range from 20 mT to 100 mT. In accordance with various embodiments, the low static magnetic field can range from 35 mT to 75 mT.

At step S130, the method S100 includes providing a radio frequency coil configured to produce cycling radio frequency field. In accordance with various embodiments, the radio frequency coil is used for spin locking at low magnetic field strengths.

At step S140, the method S100 includes applying pulsed cycling radio frequency field to the low static external magnetic field. In accordance with various embodiments, the cycling radio frequency field can range from 1 µT to 1 mT. In accordance with various embodiments, the cycling radio frequency field can range from 100 µT to 900 µT.

At step S150, the method S100 optionally includes providing a field cycling magnet. In accordance with various embodiments, the field cycling magnet can be disposed proximate to the low static external magnetic field. In accordance with various embodiments, the field cycling magnet can be disposed proximate to, e.g., in front, back, or middle of the static field magnet and is concentric with the static field magnet. In accordance with various embodiments, the field cycling magnet can be an electromagnet, a permanent magnet that is configured to move relative to the main magnet, or a permanent magnet comprising a ferromagnetic or magnetizable material that adjusts and shapes the low static external magnetic field. In accordance with various embodiments, the field cycling magnet can include an opening in center of the magnet. In accordance with various embodiments, the field cycling magnet can be a donut shape ring, a cylindrical shape ring, or an oval shape ring. In accordance with various embodiments, the field cycling magnet can include a plurality of magnets that are arranged in a ring configuration, or any other suitable shape or configuration having the plurality of magnets formed around a circumference. In accordance with various embodiments, the field cycling magnet has a magnetic field strength from 0.5 mT to 1 T. In accordance with various embodiments, the field cycling magnet has a magnetic field strength from 5 mT to 195 mT.

At step S160, the method S100 optionally includes altering the low static external magnetic field within the given field of view. In accordance with various embodiments, altering the low static external magnetic field can include at least one of increasing, decreasing, or changing direction, of the low static external magnetic field.

At step S170, the method S100 includes collecting images from the magnetic resonance system. In accordance with various embodiments, the radio frequency coil and field cycling magnet are toggled before the start of the image acquisition in order to encode the desired contrast.

Figure 8:
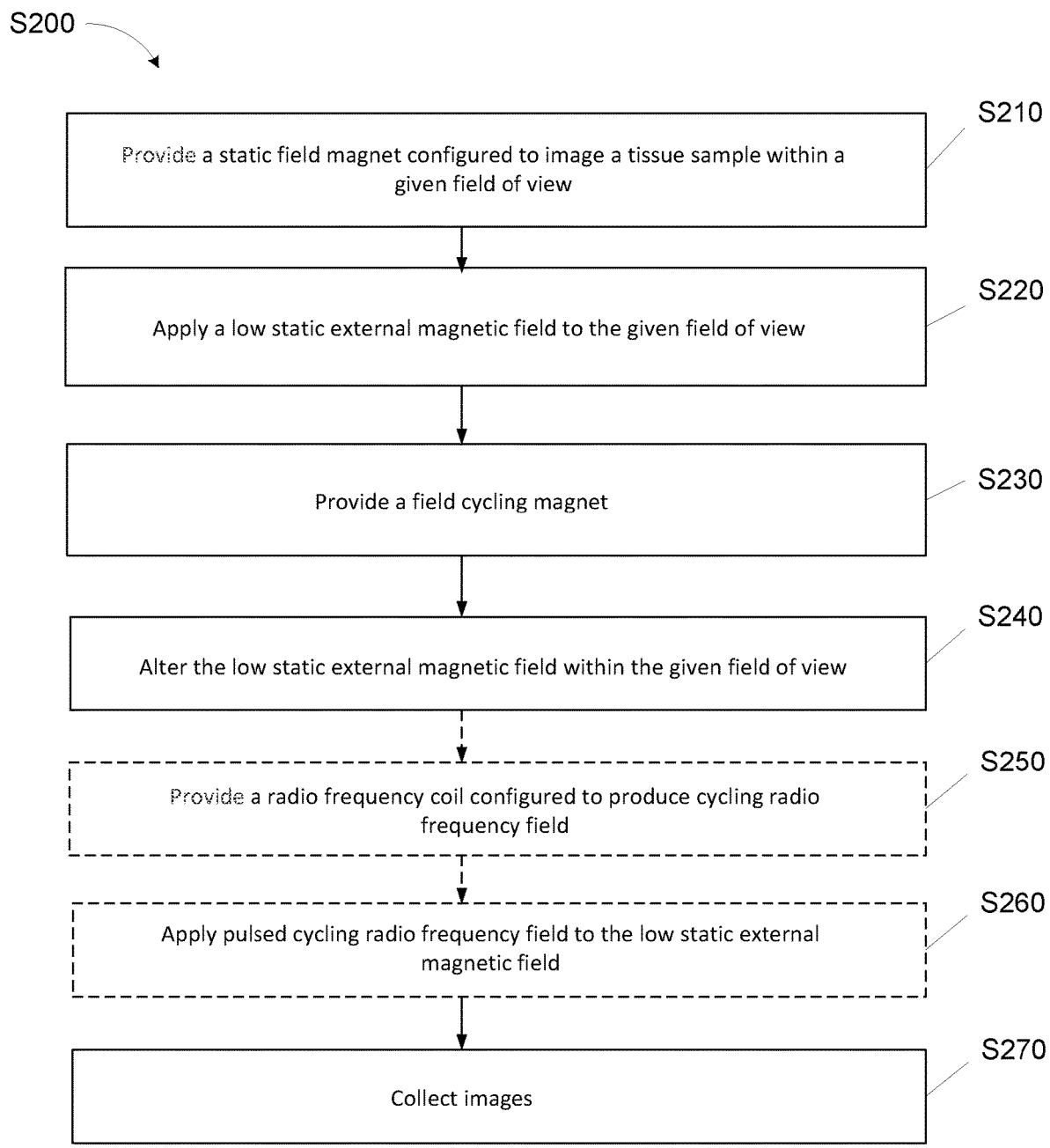
FIG. 8 is another flowchart for an example method of operating a field cycled magnetic resonance system, in accordance with various embodiments.

FIG. 8 is a flowchart for an example method S200 of operating a field cycled magnetic resonance system (e.g., systems 400, 500, or 600), according to various embodiments. In accordance with various embodiments, the magnetic resonance system is a single-sided magnetic resonance imaging system that comprises a magnetic resonance imaging scanner or a magnetic resonance imaging spectrometer. As shown in FIG. 8, the method S200 includes at step S210 providing a static field magnet configured to image a tissue sample within a given field of view. In accordance with various embodiments, the tissue sample can be any anatomical portion of a person being examined. In accordance with various embodiments, the static field magnet can include a plurality of cylindrical permanent magnets in parallel configuration. In accordance with various embodiments, the static field magnet comprises a bore in its center. In accordance with various embodiments, the bore can have a diameter between 1 inch and 20 inches. In accordance with various embodiments, the bore can have a diameter between 1 inch and 4 inches, between 4 inches and 8 inches, and between 10 inches and 20 inches. In accordance with various embodiments, the given field of view can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches.

As shown in FIG. 8, the method S200 includes at step S220 applying a low static external magnetic field to the given field of view. In accordance with various embodiments, the low static magnetic field can range from 10 mT to 1 T. In accordance with various embodiments, the low static magnetic field can range from 20 mT to 100 mT. In accordance with various embodiments, the low static magnetic field can range from 35 mT to 75 mT.

At step S230, the method S200 includes providing a field cycling magnet. In accordance with various embodiments, the field cycling magnet can be disposed proximate to the low static external magnetic field. In accordance with various embodiments, the field cycling magnet can be disposed proximate to, e.g., in front, back, or middle, of the static field magnet and is concentric with the static field magnet. In accordance with various embodiments, the field cycling magnet can be an electromagnet, a permanent magnet that is configured to move relative to the main magnet, or a permanent magnet comprising a ferromagnetic or magnetizable material that adjusts and shapes the low static external magnetic field. In accordance with various embodiments, the field cycling magnet can include an opening in center of the magnet. In accordance with various embodiments, the field cycling magnet can be a donut shape ring, a cylindrical shape ring, or an oval shape ring. In accordance with various embodiments, the field cycling magnet can include a plurality of magnets that are arranged in a ring configuration, or any other suitable shape or configuration having the plurality of magnets formed around a circumference. In accordance with various embodiments, the field cycling magnet has a magnetic field strength from 0.5 mT to 1 T. In accordance with various embodiments, the field cycling magnet has a magnetic field strength from 5 mT to 195 mT.

At step S240, the method S200 includes altering the low static external magnetic field within the given field of view. In accordance with various embodiments, altering the low static external magnetic field can include at least one of increasing, decreasing, or changing direction, of the low static external magnetic field.

At step S250, the method S200 optionally includes providing a radio frequency coil configured to produce cycling radio frequency field. In accordance with various embodiments, the radio frequency coil is used for spin locking at low magnetic field strengths.

At step S260, the method S200 optionally includes applying pulsed cycling radio frequency field to the low static external magnetic field. In accordance with various embodiments, the cycling radio frequency field can range from 1 µT to 1 mT. In accordance with various embodiments, the cycling radio frequency field can range from 100 µT to 900 µT.

At step S270, the method S200 includes collecting images from the magnetic resonance system.

Figure 9:
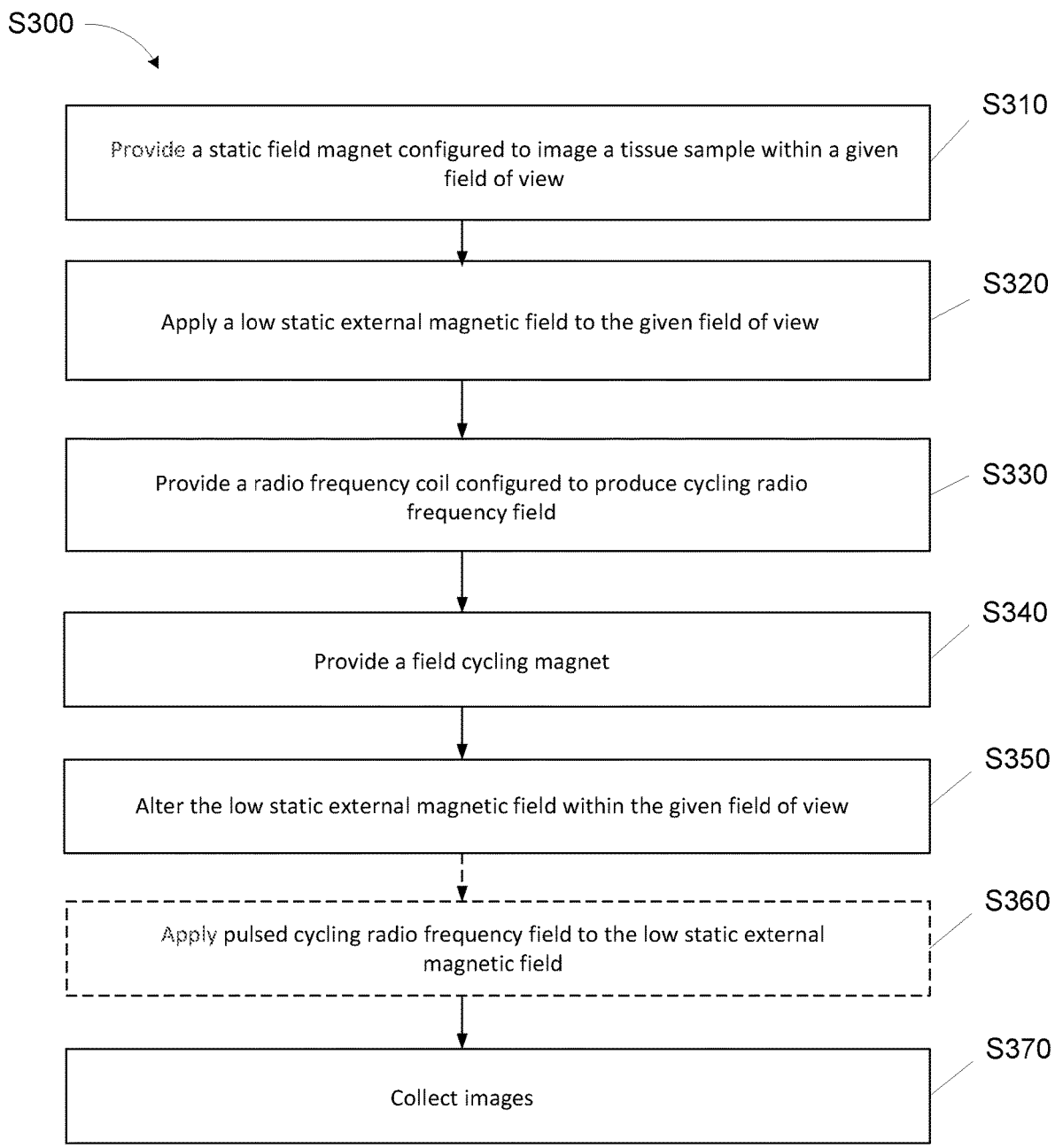
FIG. 9 is another flowchart for an example method of operating a field cycled magnetic resonance system, in accordance with various embodiments.

FIG. 9 is a flowchart for an example method S300 of operating a field cycled magnetic resonance system (e.g., systems 400, 500, or 600), according to various embodiments. In accordance with various embodiments, the magnetic resonance system is a single-sided magnetic resonance imaging system that comprises a magnetic resonance imaging scanner or a magnetic resonance imaging spectrometer. As shown in FIG. 9, the method S300 includes at step S310 providing a static field magnet configured to image a tissue sample within a given field of view. In accordance with various embodiments, the tissue sample can be any anatomical portion of a person being examined. In accordance with various embodiments, the static field magnet can include a plurality of cylindrical permanent magnets in parallel configuration. In accordance with various embodiments, the static field magnet comprises a bore in its center. In accordance with various embodiments, the bore can have a diameter between 1 inch and 20 inches. In accordance with various embodiments, the bore can have a diameter between 1 inch and 4 inches, between 4 inches and 8 inches, and between 10 inches and 20 inches. In accordance with various embodiments, the given field of view can be a spherical or cylindrical field of view. In accordance with various embodiments, the spherical field of view can be between 2 inches and 20 inches in diameter. In accordance with various embodiments, the spherical field of view can have a diameter between 1 inch and 4 inches, between 4 inches and 8 inches, and between 10 inches and 20 inches. In accordance with various embodiments, the cylindrical field of view is approximately between 2 inches and 20 inches in length. In accordance with various embodiments, the cylindrical field of view can have a length between 1 inch and 4 inches, between 4 inches and 8 inches, and between 10 inches and 20 inches.

As shown in FIG. 9, the method S300 includes at step S320 applying a low static external magnetic field to the given field of view. In accordance with various embodiments, the low static magnetic field can range from 10 mT to 1 T. In accordance with various embodiments, the low static magnetic field can range from 20 mT to 100 mT. In accordance with various embodiments, the low static magnetic field can range from 35 mT to 75 mT.

At step S330, the method S300 includes providing a radio frequency coil configured to produce cycling radio frequency field. In accordance with various embodiments, the radio frequency coil is used for spin locking at low magnetic field strengths.

At step S340, the method S200 includes providing a field cycling magnet. In accordance with various embodiments, the field cycling magnet can be disposed proximate to the low static external magnetic field. In accordance with various embodiments, the field cycling magnet can be disposed proximate to, e.g., in front, back, or middle of the static field magnet and is concentric with the static field magnet. In accordance with various embodiments, the field cycling magnet can be an electromagnet, a permanent magnet that is configured to move relative to the main magnet, or a permanent magnet comprising a ferromagnetic or magnetizable material that adjusts and shapes the low static external magnetic field. In accordance with various embodiments, the field cycling magnet can include an opening in center of the magnet. In accordance with various embodiments, the field cycling magnet can be a donut shape ring, a cylindrical shape ring, or an oval shape ring. In accordance with various embodiments, the field cycling magnet can include a plurality of magnets that are arranged in a ring configuration, or any other suitable shape or configuration having the plurality of magnets formed around a circumference. In accordance with various embodiments, the field cycling magnet has a magnetic field strength from 0.5 mT to 1 T. In accordance with various embodiments, the field cycling magnet has a magnetic field strength from 5 mT to 195 mT.

At step S350, the method S300 includes altering the low static external magnetic field within the given field of view. In accordance with various embodiments, altering the low static external magnetic field can include at least one of increasing, decreasing, or changing direction, of the low static external magnetic field.

At step S360, the method S300 optionally includes applying pulsed cycling radio frequency field to the low static external magnetic field. In accordance with various embodiments, the cycling radio frequency field can range from 1 µT to 1 mT. In accordance with various embodiments, the cycling radio frequency field can range from 100 µT to 900 µT.

At step S370, the method S300 includes collecting images from the magnetic resonance system.

RECITATION OF EMBODIMENTS

1. A magnetic resonance system comprising: a static field magnet, wherein the magnet is configured to provide a low static external magnetic field to a given field of view; and a radio frequency coil configured to apply pulsed cycling radio frequency field to the low static external magnetic field.

2. The system of embodiment 1, wherein the static field magnet comprises a plurality of cylindrical permanent magnets in parallel configuration.

3. The system of anyone of embodiments 1-2, wherein the static field magnet comprises a bore in its center, the bore having a diameter between 1 inch and 20 inches.

4. The system of anyone of embodiments 1-3, wherein the given field of view is a spherical or cylindrical field of view, wherein the spherical field of view is between 2 inches and 20 inches in diameter or the cylindrical field of view is approximately between 2 inches and 20 inches in length.

5. The system of anyone of embodiments 1-4, further comprising: a field cycling magnet disposed proximate to the static field magnet and is concentric with the static field magnet.

6. The system of anyone of embodiments 1-4, further comprising: a field cycling magnet is disposed proximate to the low static external magnetic field.

7. The system of anyone of embodiments 5-6, wherein the field cycling magnet is configured to alter the low static external magnetic field within the given field of view.

8. The system of anyone of embodiments 7, wherein the field cycling magnet is configured for altering the low static external magnetic field when the radio frequency coil is not being used.

9. The system of anyone of embodiments 5-8, wherein the field cycling magnet is an electromagnet, a permanent magnet that is configured to move relative to the main magnet, or a permanent magnet comprising a ferromagnetic or magnetizable material that adjusts and shapes the low static external magnetic field.

10. The system of anyone of embodiments 5-9, wherein the field cycling magnet includes an opening in center of the magnet.

11. The system of anyone of embodiments 5-10, wherein the field cycling magnet is a donut shape ring, a cylindrical shape ring, or an oval shape ring.

12. The system of anyone of embodiments 5-11, wherein the field cycling magnet comprises a plurality of magnets that are arranged in a ring configuration, or any other suitable shape or configuration having the plurality of magnets formed around a circumference.

13. The system of anyone of embodiments 1-12, wherein the low static magnetic field ranges from 10 mT to 1 T.

14. The system of anyone of embodiments 1-13, wherein the low static magnetic field ranges from 20 mT to 100 mT.

15. The system of The system of anyone of embodiments 1-14, wherein the low static magnetic field ranges from 35 mT to 75 mT.

16. The system of anyone of embodiments 1-15, wherein the cycling radio frequency field ranges from 1 µT to 1 mT.

17. The system of anyone of embodiments 1-16, wherein the cycling radio frequency field ranges from 100 µT to 900 µT.

18. The system of anyone of embodiments 1-17, wherein the field cycling magnet has a magnetic field strength from 0.5 mT to 1 T.

19. The system of anyone of embodiments 1-18, wherein the field cycling magnet has a magnetic field strength from 5 mT to 195 mT.

20. The system of anyone of embodiments 1-19, wherein the magnetic resonance system is a single-sided magnetic resonance imaging system that comprises a magnetic resonance imaging scanner or a magnetic resonance imaging spectrometer.

21. A magnetic resonance system comprising: a static field magnet, wherein the magnet is configured to provide a low static external magnetic field to a given field of view; and a field cycling magnet disposed proximate to the static field magnet and is concentric with the static field magnet.

22. The system of embodiment 21, wherein the field cycling magnet is disposed proximate to the low static external magnetic field.

23. The system of anyone of embodiments 21-22, wherein the static field magnet comprises a plurality of cylindrical permanent magnets in parallel configuration.

24. The system of anyone of embodiments 21-23, wherein the static field magnet comprises a bore in its center, the bore having a diameter between 1 inch and 20 inches.

25. The system of anyone of embodiments 21-24, wherein the given field of view is a spherical or cylindrical field of view, wherein the spherical field of view is between 2 inches and 20 inches in diameter or the cylindrical field of view is approximately between 2 inches and 20 inches in length.

26. The system of anyone of embodiments 21-25, wherein the field cycling magnet is configured to alter the low static magnetic field within the given field of view.

27. The system of anyone of embodiments 21-26, further comprising: a radio frequency coil configured to apply pulsed cycling radio frequency field to the low static external magnetic field.

28. The system of anyone of embodiments 26-27, wherein the field cycling magnet is configured for altering the low static external magnetic field when the radio frequency coil is not being used.

29. The system of anyone of embodiments 21-28, wherein the field cycling magnet is an electromagnet, a permanent magnet that is configured to move relative to the main magnet, or a permanent magnet comprising a ferromagnetic or magnetizable material that adjusts and shapes the low static external magnetic field.

30. The system of anyone of embodiments 21-29, wherein the field cycling magnet includes an opening in center of the magnet.

31. The system of anyone of embodiments 21-30, wherein the field cycling magnet is a donut shape ring, a cylindrical shape ring, or an oval shape ring.

32. The system of anyone of embodiments 21-31, wherein the field cycling magnet comprises a plurality of magnets that are arranged in a ring configuration, or any other suitable shape or configuration having the plurality of magnets formed around a circumference.

33. The system of anyone of embodiments 21-32, wherein the low static magnetic field ranges from 10 mT to 1 T.

34. The system of anyone of embodiments 21-33, wherein the low static magnetic field ranges from 20 mT to 100 mT.

35. The system of anyone of embodiments 21-34, wherein the low static magnetic field ranges from 35 mT to 75 mT.

36. The system of anyone of embodiments 21-35, wherein the cycling radio frequency field ranges from 1 µT to 1 mT.

37. The system of anyone of embodiments 21-36, wherein the cycling radio frequency field ranges from 100 µT to 900 µT.

38. The system of anyone of embodiments 21-37, wherein the field cycling magnet has a magnetic field strength from 0.5 mT to 1 T.

39. The system of anyone of embodiments 21-38, wherein the field cycling magnet has a magnetic field strength from 5 mT to 195 mT.

40. The system of anyone of embodiments 21-39, wherein the magnetic resonance system is a single-sided magnetic resonance imaging system that comprises a magnetic resonance imaging scanner or a magnetic resonance imaging spectrometer.

41. A magnetic resonance system comprising: a static field magnet, wherein the magnet is configured to provide a low static external magnetic field to a given field of view; a radio frequency coil; and a field cycling magnet.

42. The system of embodiment 41, wherein the static field magnet comprises a plurality of cylindrical permanent magnets in parallel configuration.

43. The system of anyone of embodiments 41-42, wherein the static field magnet comprises a bore in its center, the bore having a diameter between 1 inch and 20 inches.

44. The system of anyone of embodiments 41-43, wherein the given field of view is a spherical or cylindrical field of view, wherein the spherical field of view is between 2 inches and 20 inches in diameter or the cylindrical field of view is approximately between 2 inches and 20 inches in length.

45. The system of anyone of embodiments 41-44, wherein the radio frequency coil is configured to apply pulsed cycling radio frequency field to the low static external magnetic field.

46. The system of anyone of embodiments 41-45, wherein the field cycling magnet is disposed proximate to the static field magnet and is concentric with the static field magnet.

47. The system of anyone of embodiments 41-46, wherein the field cycling magnet is disposed proximate to the low static external magnetic field.

48. The system of anyone of embodiments 41-47, wherein the field cycling magnet is configured to alter the low static external magnetic field within the given field of view.

49. The system of embodiment 48, wherein the field cycling magnet is configured for altering the low static external magnetic field when the radio frequency coil is not being used.

50. The system of anyone of embodiments 41-49, wherein the field cycling magnet is an electromagnet, a permanent magnet that is configured to move relative to the main magnet, or a permanent magnet comprising a ferromagnetic or magnetizable material that adjusts and shapes the low static external magnetic field.

51. The system of anyone of embodiments 41-50, wherein the field cycling magnet includes an opening in center of the magnet.

52. The system of anyone of embodiments 41-51, wherein the field cycling magnet is a donut shape ring, a cylindrical shape ring, or an oval shape ring.

53. The system of anyone of embodiments 41-52, wherein the field cycling magnet comprises a plurality of magnets that are arranged in a ring configuration, or any other suitable shape or configuration having the plurality of magnets formed around a circumference.

54. The system of anyone of embodiments 41-53, wherein the low static magnetic field ranges from 10 mT to 1 T.

55. The system of anyone of embodiments 41-54, wherein the low static magnetic field ranges from 20 mT to 100 mT.

56. The system of anyone of embodiments 41-55, wherein the cycling radio frequency field ranges from 1 µT to 1 mT.

57. The system of anyone of embodiments 41-56, wherein the cycling radio frequency field ranges from 100 µT to 900 µT.

58. The system of anyone of embodiments 41-57, wherein the field cycling magnet has a magnetic field strength from 0.5 mT to 1 T.

59. The system of anyone of embodiments 41-58, wherein the field cycling magnet has a magnetic field strength from 5 mT to 195 mT.

60. The system of anyone of embodiments 41-59, wherein the magnetic resonance system is a single-sided magnetic resonance imaging system that comprises a magnetic resonance imaging scanner or a magnetic resonance imaging spectrometer.

61. A method of operating a field cycled magnetic resonance system: providing a static field magnet configured to image a tissue sample within a given field of view; applying a low static external magnetic field to the given field of view; providing a radio frequency coil configured to produce cycling radio frequency field; applying pulsed cycling radio frequency field to the low static external magnetic field; and collecting images from the system.

62. The method of embodiment 61, further comprising: providing a field cycling magnet; and altering the low static external magnetic field within the given field of view.

63. The method of anyone of embodiments 61-62, wherein altering the low static external magnetic field includes at least one of increasing, decreasing, or changing direction, of the low static external magnetic field.

64. The method of anyone of embodiments 61-63, wherein the static field magnet comprises a plurality of cylindrical permanent magnets in parallel configuration.

65. The method of anyone of embodiments 61-64, wherein the static field magnet comprises a bore in its center, the bore having a diameter between 1 inch and 20 inches.

66. The method of anyone of embodiments 61-65, wherein the given field of view is a spherical or cylindrical field of view, wherein the spherical field of view is between 2 inches and 20 inches in diameter or the cylindrical field of view is approximately between 2 inches and 20 inches in length.

67. The method of anyone of embodiments 61-66, wherein the field cycling magnet is disposed proximate to the low static external magnetic field.

68. The method of anyone of embodiments 61-67, wherein the field cycling magnet is disposed proximate to the static field magnet and is concentric with the static field magnet.

69. The method of anyone of embodiments 61-68, wherein the field cycling magnet is an electromagnet, a permanent magnet that is configured to move relative to the main magnet, or a permanent magnet comprising a ferromagnetic or magnetizable material that adjusts and shapes the low static external magnetic field.

70. The method of anyone of embodiments 61-69, wherein the field cycling magnet includes an opening in center of the magnet.

71. The method of anyone of embodiments 61-70, wherein the field cycling magnet is a donut shape ring, a cylindrical shape ring, or an oval shape ring.

72. The method of anyone of embodiments 61-71, wherein the field cycling magnet comprises a plurality of magnets that are arranged in a ring configuration, or any other suitable shape or configuration having the plurality of magnets formed around a circumference.

73. The method of anyone of embodiments 61-72, wherein the low static magnetic field ranges from 10 mT to 1 T.

74. The method of anyone of embodiments 61-73, wherein the low static magnetic field ranges from 20 mT to 100 mT.

75. The method of anyone of embodiments 61-74, wherein the low static magnetic field ranges from 35 mT to 75 mT.

76. The method of anyone of embodiments 61-75, wherein the cycling radio frequency field ranges from 1 µT to 1 mT.

77. The method of anyone of embodiments 61-76, wherein the cycling radio frequency field ranges from 100 µT to 900 µT.

78. The method of anyone of embodiments 61-77, wherein the field cycling magnet has a magnetic field strength from 0.5 mT to 1 T.

79. The method of anyone of embodiments 61-78, wherein the field cycling magnet has a magnetic field strength from 5 mT to 195 mT.

80. The method of anyone of embodiments 61-79, wherein the magnetic resonance system is a single-sided magnetic resonance imaging system that comprises a magnetic resonance imaging scanner or a magnetic resonance imaging spectrometer.

81. A method of operating a field cycled magnetic resonance system: providing a static field magnet configured to image a tissue sample within a given field of view; applying a low static external magnetic field to the given field of view; providing a field cycling magnet; altering the low static external magnetic field within the given field of view; and collecting images from the system.

82. The method of embodiment 81, wherein altering the low static external magnetic field includes at least one of increasing, decreasing, or changing direction, of the low static external magnetic field.

83. The method of anyone of embodiments 81-82, further comprising: providing a radio frequency coil configured to produce cycling radio frequency field; and applying pulsed cycling radio frequency field to the low static external magnetic field.

84. The method of anyone of embodiments 81-83, wherein the field cycling magnet is disposed proximate to the low static external magnetic field.

85. The method of anyone of embodiments 81-84, wherein the field cycling magnet is disposed proximate to the static field magnet and is concentric with the static field magnet.

86. The method of anyone of embodiments 81-85, wherein the static field magnet comprises a plurality of cylindrical permanent magnets in parallel configuration.

87. The method of anyone of embodiments 81-86, wherein the static field magnet comprises a bore in its center, the bore having a diameter between 1 inch and 20 inches.

88. The method of anyone of embodiments 81-87, wherein the given field of view is a spherical or cylindrical field of view, wherein the spherical field of view is between 2 inches and 20 inches in diameter or the cylindrical field of view is approximately between 2 inches and 20 inches in length.

89. The method of anyone of embodiments 81-88, wherein the field cycling magnet is an electromagnet, a permanent magnet that is configured to move relative to the main magnet, or a permanent magnet comprising a ferromagnetic or magnetizable material that adjusts and shapes the low static external magnetic field.

90. The method of anyone of embodiments 81-89, wherein the field cycling magnet includes an opening in center of the magnet.

91. The method of anyone of embodiments 81-90, wherein the field cycling magnet is a donut shape ring, a cylindrical shape ring, or an oval shape ring.

92. The method of anyone of embodiments 81-91, wherein the field cycling magnet comprises a plurality of magnets that are arranged in a ring configuration, or any other suitable shape or configuration having the plurality of magnets formed around a circumference.

93. The method of anyone of embodiments 81-92, wherein the low static magnetic field ranges from 10 mT to 1 T.

94. The method of anyone of embodiments 81-93, wherein the low static magnetic field ranges from 20 mT to 100 mT.

95. The method of anyone of embodiments 81-94, wherein the low static magnetic field ranges from 35 mT to 75 mT.

96. The method of anyone of embodiments 81-95, wherein the cycling radio frequency field ranges from 1 µT to 1 mT.

97. The method of anyone of embodiments 81-96, wherein the cycling radio frequency field ranges from 100 µT to 900 µT.

98. The method of anyone of embodiments 81-97, wherein the field cycling magnet has a magnetic field strength from 0.5 mT to 1 T.

99. The method of anyone of embodiments 81-98, wherein the field cycling magnet has a magnetic field strength from 5 mT to 195 mT.

100. The method of anyone of embodiments 81-99, wherein the magnetic resonance system is a single-sided magnetic resonance imaging system that comprises a magnetic resonance imaging scanner or a magnetic resonance imaging spectrometer.

101. A method of operating a field cycled magnetic resonance system: providing a static field magnet configured to image a tissue sample within a given field of view; applying a low static external magnetic field to the given field of view; providing a radio frequency coil configured to produce cycling radio frequency field; providing a field cycling magnet; altering the low static external magnetic field within the given field of view; and collecting images from the system.

102. The method of embodiment 101, wherein altering the low static external magnetic field includes at least one of increasing, decreasing, or changing direction, of the low static external magnetic field.

103. The method of anyone of embodiments 101-102, further comprising: applying pulsed cycling radio frequency field to the low static external magnetic field.

104. The method of anyone of embodiments 101-103, wherein the static field magnet comprises a plurality of cylindrical permanent magnets in parallel configuration.

105. The method of anyone of embodiments 101-104, wherein the static field magnet comprises a bore in its center, the bore having a diameter between 1 inch and 20 inches.

106. The method of anyone of embodiments 101-105, wherein the given field of view is a spherical or cylindrical field of view, wherein the spherical field of view is between 2 inches and 20 inches in diameter or the cylindrical field of view is approximately between 2 inches and 20 inches in length.

107. The method of anyone of embodiments 101-106, wherein the field cycling magnet is disposed proximate to the low static external magnetic field.

108. The method of anyone of embodiments 101-107, wherein the field cycling magnet is disposed proximate to the static field magnet and is concentric with the static field magnet.

109. The method of anyone of embodiments 101-108, wherein the field cycling magnet is an electromagnet, a permanent magnet that is configured to move relative to the main magnet, or a permanent magnet comprising a ferromagnetic or magnetizable material that adjusts and shapes the low static external magnetic field.

110. The method of anyone of embodiments 101-109, wherein the field cycling magnet includes an opening in center of the magnet.

111. The method of anyone of embodiments 101-110, wherein the field cycling magnet is a donut shape ring, a cylindrical shape ring, or an oval shape ring.

112. The method of anyone of embodiments 101-111, wherein the field cycling magnet comprises a plurality of magnets that are arranged in a ring configuration, or any other suitable shape or configuration having the plurality of magnets formed around a circumference.

113. The method of anyone of embodiments 101-112, wherein the low static magnetic field ranges from 10 mT to 1 T.

114. The method of anyone of embodiments 101-113, wherein the low static magnetic field ranges from 20 mT to 100 mT.

115. The method of anyone of embodiments 101-114, wherein the low static magnetic field ranges from 35 mT to 75 mT.

116. The method of anyone of embodiments 101-115, wherein the cycling radio frequency field ranges from 1 µT to 1 mT.

117. The method of anyone of embodiments 101-116, wherein the cycling radio frequency field ranges from 100 µT to 900 µT.

118. The method of anyone of embodiments 101-117, wherein the field cycling magnet has a magnetic field strength from 0.5 mT to 1 T.

119. The method of anyone of embodiments 101-118, wherein the field cycling magnet has a magnetic field strength from 5 mT to 195 mT.

120. The method of anyone of embodiments 101-119, wherein the magnetic resonance system is a single-sided magnetic resonance imaging system that comprises a magnetic resonance imaging scanner or a magnetic resonance imaging spectrometer.

While this specification contains many specific implementation details, these should not be construed as limitations on the scope of any embodiments or of what may be claimed, but rather as descriptions of features specific to particular implementations of particular embodiments. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed:

1. A magnetic resonance system comprising:
   a static field magnet, wherein the magnet is configured to provide a low static external magnetic field to a given field of view; and
   a radio frequency coil configured to apply pulsed cycling radio frequency field to the low static external magnetic field, wherein the static field magnet and the radio frequency coil are positioned only on one side of the given field of view for imaging a patient.

2. The system of claim 1, wherein the static field magnet comprises a bore in its center, the bore having a diameter between 1 inch and 20 inches.

3. The system of claim 1, wherein the given field of view is a spherical or cylindrical field of view, wherein the spherical field of view is between 2 inches and 20 inches in diameter or the cylindrical field of view is approximately between 2 inches and 20 inches in length.

4. The system of claim 1, further comprising:
   a field cycling magnet is disposed proximate to the low static external magnetic field.

5. The system of claim 1, wherein the low static magnetic field ranges from 10 mT to 1 T.

6. The system of claim 1, wherein the cycling radio frequency field ranges from 1 µT to 1 mT.

7. The system of claim 1, wherein the magnetic resonance system is a single-sided magnetic resonance imaging system that comprises a magnetic resonance imaging scanner or a magnetic resonance imaging spectrometer.

8. A magnetic resonance system comprising:
   a static field magnet, wherein the magnet is configured to provide a low static external magnetic field to a given field of view; and
   a field cycling magnet disposed proximate to the static field magnet and is concentric with the static field magnet, wherein the static field magnet and the field cycling magnet are positioned only on one side of the given field of view for imaging a patient.

9. The system of claim 8, further comprising:
   a radio frequency coil configured to apply pulsed cycling radio frequency field to the low static external magnetic field.

10. The system of claim 9, wherein the field cycling magnet is configured for altering the low static external magnetic field when the radio frequency coil is not being used.

11. The system of claim 8, wherein the low static magnetic field ranges from 10 mT to 1 T.

12. The system of claim 8, wherein the field cycling magnet has a magnetic field strength from 0.5 mT to 1 T.

13. The system of claim 8, wherein the magnetic resonance system is a single-sided magnetic resonance imaging system that comprises a magnetic resonance imaging scanner or a magnetic resonance imaging spectrometer.

14. A magnetic resonance system comprising:
   a static field magnet, wherein the magnet is configured to provide a low static external magnetic field to a given field of view;
   a radio frequency coil; and
   a field cycling magnet, wherein the static field magnet, the radio frequency coil, and the field cycling magnet are positioned only on one side of the given field of view for imaging a patient.

15. The system of claim 14, wherein the static field magnet comprises a bore in its center, the bore having a diameter between 1 inch and 20 inches.

16. The system of claim 14, wherein the given field of view is a spherical or cylindrical field of view, wherein the spherical field of view is between 2 inches and 20 inches in diameter or the cylindrical field of view is approximately between 2 inches and 20 inches in length.

17. The system of claim 14, wherein the field cycling magnet is configured for altering the low static external magnetic field when the radio frequency coil is not being used.

18. The system of claim 14, wherein the low static magnetic field ranges from 10 mT to 1 T.

19. The system of claim 14, wherein the low static magnetic field ranges from 20 mT to 100 mT.

20. The system of claim 14, wherein the magnetic resonance system is a single-sided magnetic resonance imaging system that comprises a magnetic resonance imaging scanner or a magnetic resonance imaging spectrometer.

* * * * *